United States Patent
Higashiguchi et al.

[11] Patent Number: 5,828,128
[45] Date of Patent: Oct. 27, 1998

[54] SEMICONDUCTOR DEVICE HAVING A BUMP WHICH IS INSPECTED FROM OUTSIDE AND A CIRCUIT BOARD USED WITH SUCH A SEMICONDUCTOR DEVICE

[75] Inventors: Yutaka Higashiguchi; Toshio Kumai; Yasuhiro Teshima; Mamoru Niishiro; Yasushi Kobayashi; Yukio Sekiya; Shuzo Igarashi; Yasuhiro Ichihara, all of Kawasaki, Japan

[73] Assignee: Fujitsu, Ltd., Kawasaki, Japan

[21] Appl. No.: 604,429

[22] Filed: Feb. 21, 1996

[30] Foreign Application Priority Data

Aug. 1, 1995  [JP]  Japan ................................. 7-196482

[51] Int. Cl.⁶ ........................ H01L 23/48; H01L 23/52; H01L 29/40
[52] U.S. Cl. .................... 257/738; 257/737; 257/739; 257/778; 257/779; 257/780; 438/108; 438/613
[58] Field of Search ....................... 257/673, 737, 257/738, 739, 778, 779, 780; 438/108, 613

[56] References Cited

U.S. PATENT DOCUMENTS

| | | | |
|---|---|---|---|
| 5,010,389 | 4/1991 | Gansauge et al. | 257/738 |
| 5,214,308 | 5/1993 | Nishiguchi et al. | 257/692 |
| 5,376,584 | 12/1994 | Agarwala | 437/183 |
| 5,461,261 | 10/1995 | Nishiguchi | 257/781 |
| 5,465,152 | 11/1995 | Bilodeau et al. | 356/371 |
| 5,598,036 | 1/1997 | Ho | 257/738 |
| 5,600,180 | 2/1997 | Kusaka et al. | 257/692 |

FOREIGN PATENT DOCUMENTS

| | | |
|---|---|---|
| 56-114358 | 9/1981 | Japan . |
| 6-27026 | 2/1994 | Japan . |
| 6-188287 | 7/1994 | Japan . |

*Primary Examiner*—Jerome Jackson
*Assistant Examiner*—Allan R. Wilson
*Attorney, Agent, or Firm*—Staas & Halsey

[57] ABSTRACT

A BGA-type semiconductor device has a soldering bump a soldered state of which can be easily checked by visual inspection. A package has a bottom surface which faces the wiring board when the semiconductor device is mounted on the wiring board. A plurality of soldering bumps are provided on the bottom surface of the package. The soldering bumps are in a plurality of different sizes, and are located in positions where the soldering bumps are observable from outside of the package when the semiconductor device is mounted on the wiring board.

3 Claims, 24 Drawing Sheets

GOOD PRINTING ⇒ TO MOUNTING PROCESS

BAD PRINTING ⇒ REJECTED

FIG. 12
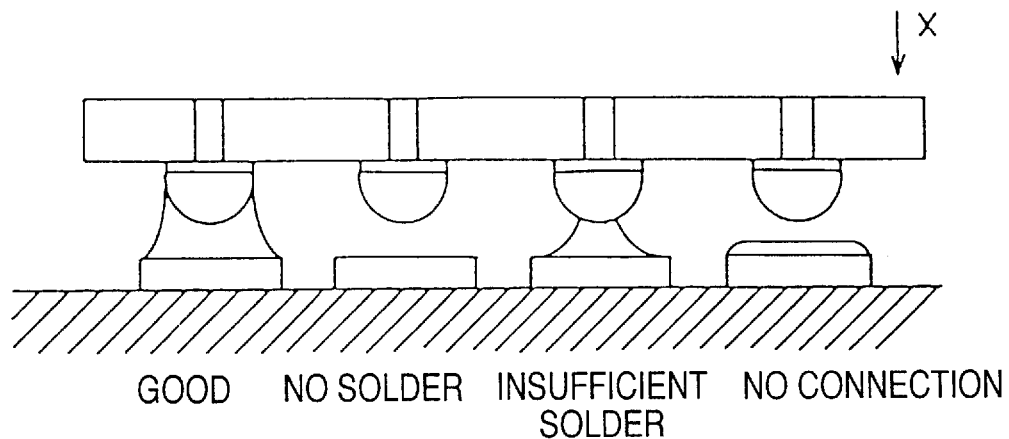
X-RAY TRANSMISSION IMAGE
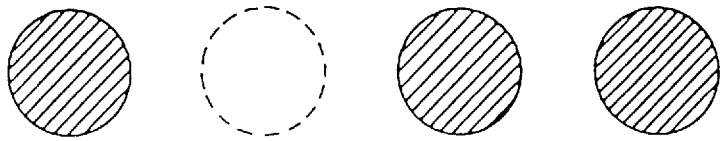
FIG. 13A         FIG. 13B
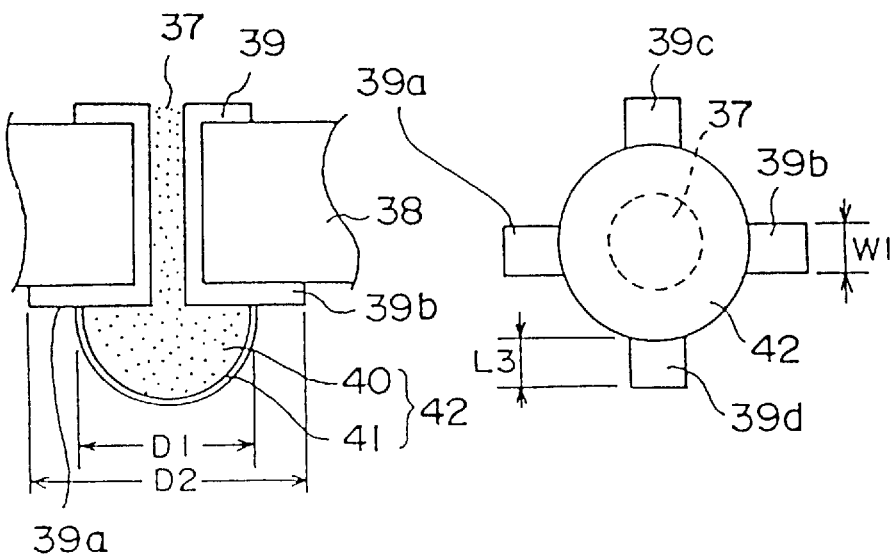

(CROSS SECTION) (VIEW FROM BUMP)

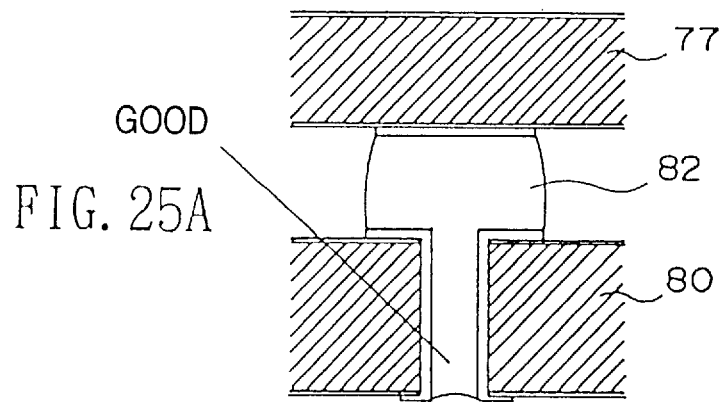
FIG. 25A GOOD
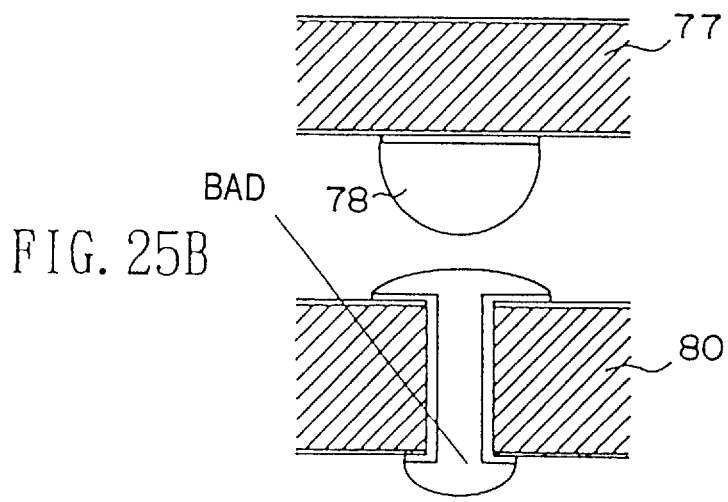
FIG. 25B BAD
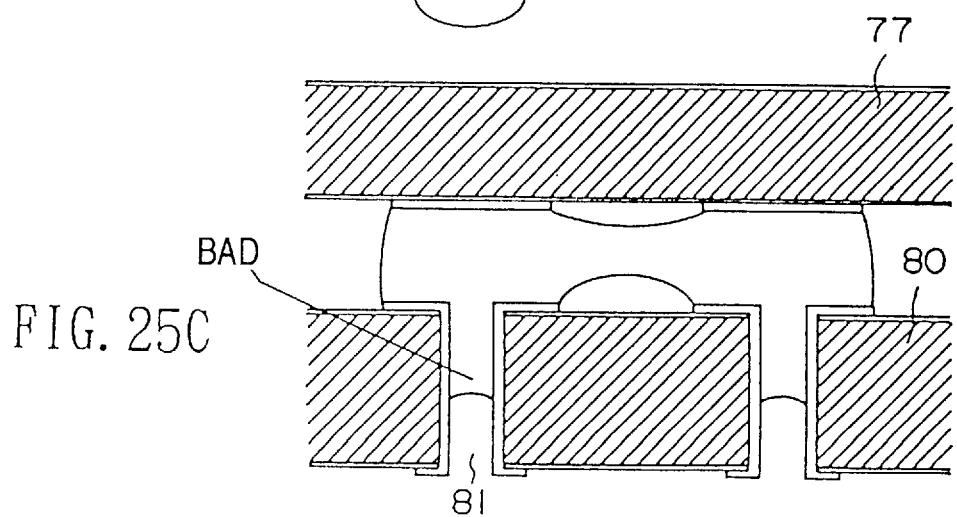
FIG. 25C BAD

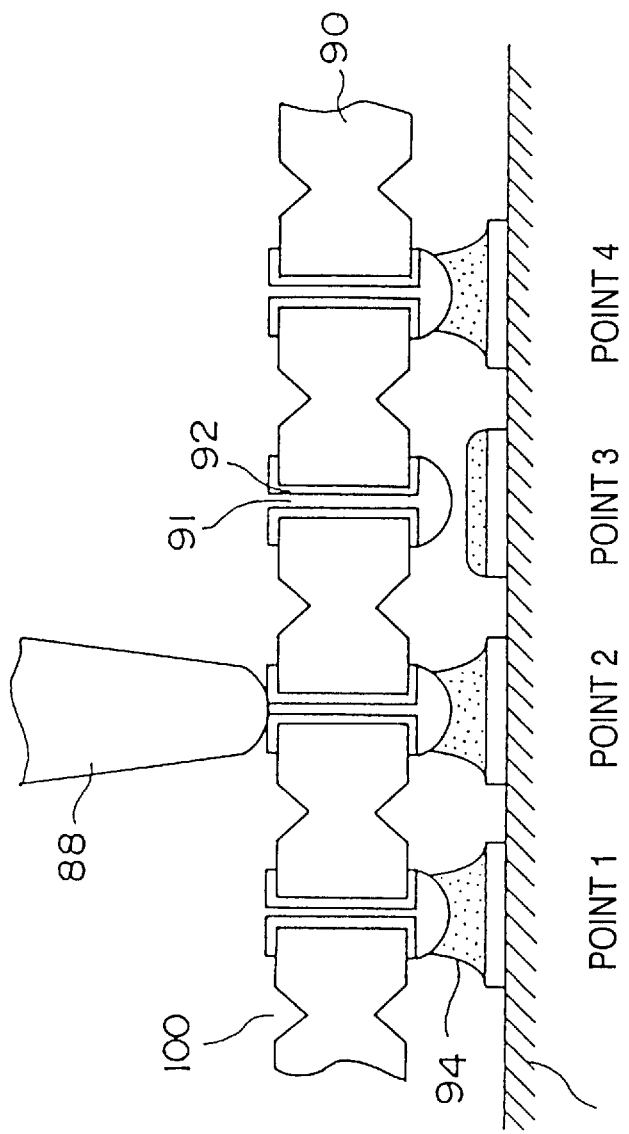

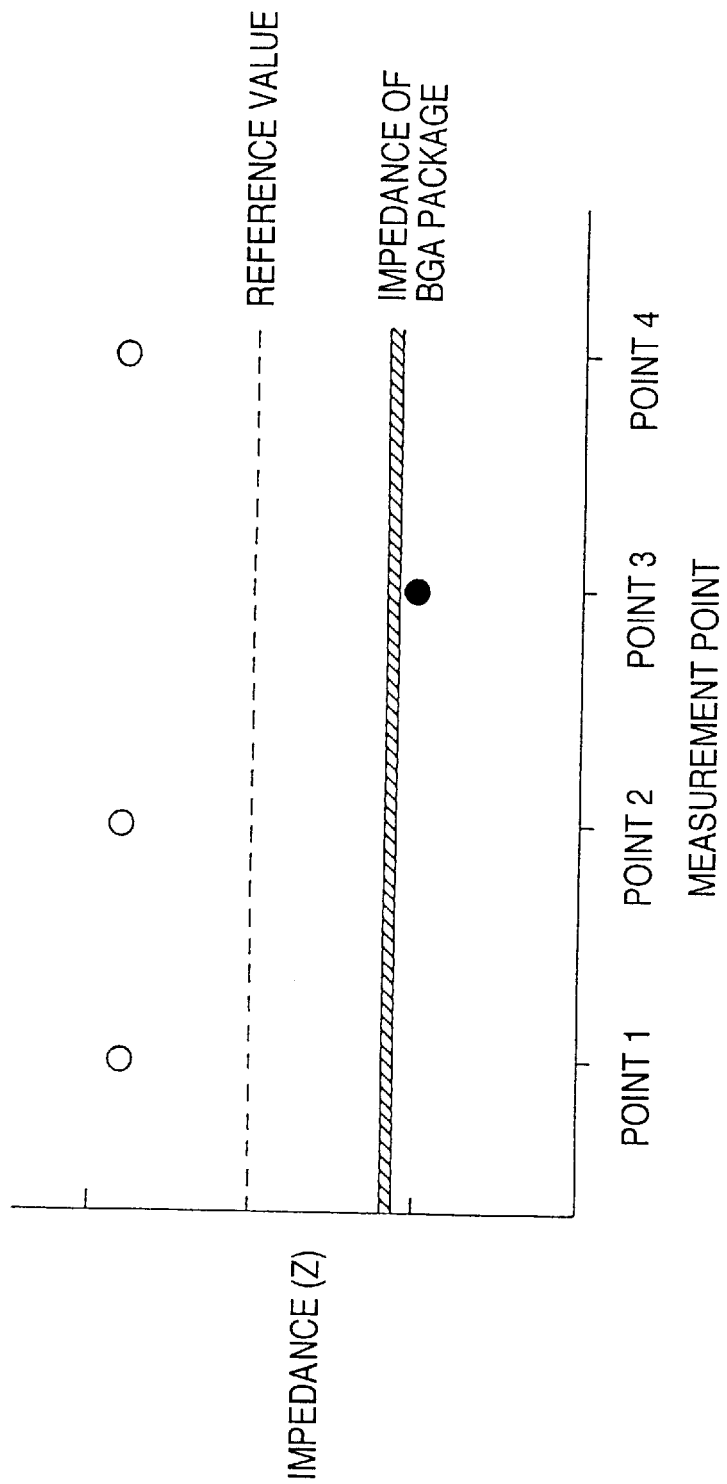

SEMICONDUCTOR DEVICE HAVING A BUMP WHICH IS INSPECTED FROM OUTSIDE AND A CIRCUIT BOARD USED WITH SUCH A SEMICONDUCTOR DEVICE

BACKGROUND OF THE INVENTION

1. Field of the Invention

The present invention relates to a semiconductor device having a package molding electronic parts such as semiconductor chips and, more particularly, to a semiconductor device of a ball grid array type (hereinafter abbreviated as BGA type) which can improve an accuracy of inspection for checking a state of a soldered part.

Recently, semiconductor devices are highly integrated, and a high-density mountability of the semiconductor device is required. In such circumstances, a BGA-type semiconductor device has been a focus. The BGA-type semiconductor device has a feature that ball-like connecting terminals can be provided on a bottom surface of the package in an array-like arrangement with a pitch greater than that of a QFP type semiconductor device. Additionally, the BGA-type semiconductor device has a feature that the ball-like connecting terminals are hardly deformed as compared to the terminals of the QFP-type semiconductor device.

Since the connecting terminals of the QFP type semiconductor device are provided along edges of the package, a state of connection of the connecting terminals soldered onto a wiring board (referred to as a printed-circuit board, circuit board, a mother board or simply a board) can be easily checked by visual inspection. However, since the BGA-type semiconductor device has the ball-like connecting terminals on a bottom surface of the package in an array-like arrangement, it is difficult to check the soldered state of the terminals provided on an inner side of the bottom surface by visual inspection from outside. The present invention eliminates such a problem in the inspection performed on the soldered state of the connecting terminals of the BGA-type semiconductor device.

2. Description of the Related Art

A description will now be given, with reference to FIG. 1, of a conventional BGA-type semiconductor device. FIG. 1 is a plan view of a bottom surface of a package 10 of a conventional BGA-type semiconductor device. A bare chip such as an LSI is molded in the package 10. Ball-like soldering bumps are provided in a matrix-like arrangement on the bottom surface of the package 10 except in an area directly below the bare chip. Each of the ball-like soldering bumps 12 comprises a copper core having a cover which is metalized by a nickel and gold alloy (Ni—Au).

FIG. 2 is a perspective view of the BGA-type semiconductor device placed on a wiring board 14. The soldering bumps 12 are soldered to respective footprints (pads) 16 provided on the wiring board 14. Before mounting the BGA semiconductor device, solder paste is applied on the footprints 16 of the wiring board 14 by using a metal mask. Thereafter, the BGA-type semiconductor device is placed on the solder paste applied on the footprints 16. Then, the BGA-type semiconductor device is mounted on the wiring board 14 by performing a solder reflowing process.

When a state of a soldered portion is checked by visual inspection or using a microscope, checking of all of the soldering bumps 12 is difficult since some of the soldering bumps 12 are provided on an inner side of the bottom surface of the package 10. For example, the soldering bump 12a shown in FIG. 1 can be easily checked since the soldering bump 12a is located in the outermost position among the soldering bumps 12. However, it is difficult to check the soldering bump 12b from outside of the package 10 since the soldering bump 12b is located on an inner side of the bottom surface. Checking of the soldered state of the soldering bumps 12 is performed by observing a solder fillet formed by a solder reflowing process. The solder fillet is a part of solder connecting the soldering bump 12 to the footprint 16, and is formed between the soldering bump 12 and the footprint 16. Generally, a height of the soldering bump 12 is about 0.35 mm. Thus, it is very difficult to check the soldering bump 12 located far inside from an edge of the bottom surface of the package 10 by visual inspection.

SUMMARY OF THE INVENTION

It is a general object of the present invention to provide an improved and useful BGA-type semiconductor device and wiring board in which the above-mentioned problem is eliminated.

A more specific object of the present invention is to provide a BGA-type semiconductor device having a soldering bump a soldered state of which can be easily checked by visual inspection.

Another object of the present invention is to provide a wiring board a soldered state of which can be easily checked by visual inspection when a BGA-type semiconductor device is soldered thereto.

In order to achieve the above-mentioned objects, there is provided according to one aspect of the present invention a semiconductor device mountable to a wiring board, comprising:

a package having a bottom surface which faces the wiring board when the semiconductor device is mounted on the wiring board; and a plurality of soldering bumps provided on the bottom surface of the package, the plurality of soldering bumps being in a plurality of different sizes, the plurality of soldering bumps being located in positions where the plurality of soldering bumps are observable from outside of the package when the semiconductor device is mounted on the wiring board.

According to the above-mentioned invention, a soldered state of all of the soldering bumps can be determined as to whether the soldered state is good or not good by observing the soldered state of the plurality of soldering bumps in the plurality of sizes. Probability of occurrence of a bad soldered state is increased by providing the different sized soldering bumps. That is, the different sized soldering bumps create a critical condition of soldering. If a bad soldered state does not occur in the critical condition, it can be determined that regular soldering bumps other than the observed soldering bumps are in a good soldered state. This achieves an easy inspection of the soldered state with a high accuracy.

In one embodiment of the present invention, the plurality of soldering bumps includes a first soldering bump, a second soldering bump, and a third soldering bump, the first soldering bump being larger than the second soldering bump, the third soldering bump being smaller than the second bump. The plurality of soldering bumps are located in the vicinity of sides of the bottom surface of the package, adjacent soldering bumps among the plurality of soldering bumps having different sizes. The plurality of soldering bumps may have different diameters and different heights. The plurality of soldering bumps may include a first soldering bump having a regular size and a second soldering bump smaller than the first soldering bump, the second soldering bump being located in the vicinity of a side of the package.

Additionally, the plurality of soldering bumps may include a first soldering bump having a regular size and a second soldering bump smaller than the first soldering bump, the second soldering bump being located in an area where a bad soldered state may occur, the package having a conductive member electrically connected to the second soldering bump, the conductive member being electrically connected to an external apparatus in a state where the semiconductor device is mounted on the wiring board.

Additionally, there is provided according to another aspect of the present invention a semiconductor device mountable to a wiring board, comprising:

a package having a bottom surface which faces the wiring board when the semiconductor device is mounted on the wiring board; and a plurality of soldering bumps provided on the bottom surface of the package, the plurality of soldering bumps including two adjacent soldering bumps arranged with a pitch smaller than pitches between other soldering bumps, the two adjacent soldering bumps being located in the vicinity of a side of the package.

According to this invention, the critical condition for the soldering of the soldering bumps is created by the two adjacent soldering bumps. If a solder bridge is not formed between the two adjacent soldering bumps, it can be determined that regular soldering bumps other than the two adjacent soldering bumps are in a good soldered state. This achieves an easy inspection of the soldered state with a high accuracy.

Additionally, there is provided according to another aspect of the present invention a semiconductor device mountable to a wiring board, comprising:

a package having a bottom surface which faces the wiring board when the semiconductor device is mounted on the wiring board; and a plurality of soldering bumps provided on the bottom surface of the package, the plurality of soldering bumps including two adjacent soldering bumps arranged with a pitch smaller than pitches between other soldering bumps, the two adjacent soldering bumps being located in an area where a bad soldered state may occur, the package having conductive members electrically connected to the two adjacent soldering bumps, respectively, the conductive members being electrically connected to an external apparatus in a state where the semiconductor device is mounted on the wiring board.

According to this invention, the critical condition for the soldering of the soldering bumps is created by the two adjacent soldering bumps. If a solder bridge is not formed between the two adjacent soldering bumps, it can be determined that regular soldering bumps other than the two adjacent soldering bumps are in a good soldered state. The formation of the solder bridge can be recognized when there is a continuity between the two adjacent soldering bumps. This achieves an easy inspection of the soldered state with a high accuracy.

Additionally, there is provided according to another aspect of the present invention a semiconductor device mountable to a wiring board, comprising:

a package having a bottom surface which faces the wiring board when the semiconductor device is mounted on the wiring board; and a plurality of soldering bumps provided on the bottom surface of the package, at least one of the plurality of soldering bumps having a plurality of conductive patterns extending in predetermined directions.

According to this invention, if a soldering bump is in a good soldered state, solder flows on the conductive patterns. Thus, the determination of the soldered state as to whether it is good or not good can be made by observing a solder adhered on the conductive patterns. Observation of the soldered state can be made by using an X-ray transmission method. The plurality of conductive patterns may comprise four patterns radially extending from the one of the plurality of soldering bumps at equally divided angles.

Additionally, there is provided according to another aspect of the present invention a semiconductor device mountable to a wiring board, comprising:

a package having a bottom surface which faces the wiring board when the semiconductor device is mounted on the wiring board; and a plurality of soldering bumps provided on the bottom surface of the package, the plurality of soldering bumps including at least one soldering bump having a slit having a predetermined shape, the at least one soldering bump being observable when the semiconductor device is mounted on the wiring board.

According to this invention, a solder enters into at least a portion of the slit when the soldering bump is in a good soldered state. Thus, the determination of the soldered state as to whether it is good or not good can be made by observing a solder adhered inside the slit. The predetermined shape of the slit may be a cross shape.

Additionally, there is provided according to another aspect of the present invention a semiconductor device mountable to a wiring board, comprising:

a package having a bottom surface and a top surface opposite to the bottom surface, the bottom surface facing the wiring board when the semiconductor device is mounted on the wiring board;

a plurality of soldering bumps provided on the bottom surface of the package; and a grid-like slit formed on each of the bottom surface and top surface of the package, the grid-like slit acoustically separating each of the plurality of soldering bumps from other soldering bumps when an ultrasonic wave is transmitted to inspect a soldered state of each of the plurality of soldering bumps.

According to this invention, since the grid-like slit acoustically separates each soldering bump from other soldering bumps, a noise due to an ultrasonic wave reflected from adjacent soldering bumps is not generated. Thus an inspection using an ultrasonic method can be performed with a high accuracy.

Additionally, there is provided according to another aspect of the present invention a semiconductor device mountable to a wiring board, comprising:

a package having a bottom surface and a top surface opposite to the bottom surface, the bottom surface facing the wiring board when the semiconductor device is mounted on the wiring board;

a plurality of soldering bumps provided on the bottom surface of the package; and a plurality of light reflecting members provided on the top surface, the light reflecting members reflecting respective light beams incident thereon so that a deformation of the package is detected by deflection of the reflected light beams.

According to this invention, a soldered state of the soldering bumps as to whether it is good or not good can be determined based on a magnitude of a deformation of the package of the semiconductor device. Thus, an easy inspection of the soldered state can be performed with a high accuracy.

Additionally, there is provided according to another aspect of the present invention a mounting construction of a semiconductor device to a wiring board, the mounting construction comprising:

a package of the semiconductor device having a bottom surface which faces the wiring board when the semiconductor device is mounted on the wiring board;

a plurality of flat electrodes provided on the bottom surface of the package; and a plurality of through holes provided in the wiring board, a solid solder being placed in each of the through holes so that the flat electrodes are placed on respective solid solder when the semiconductor device is mounted to the wiring board.

According to this invention, ball-like soldering bumps are not necessary for mounting the semiconductor device to the wiring board. Thus, the manufacturing process of the semiconductor device can be simplified and manufacturing cost can be reduced. The solid solder may have a ball-like shape having a diameter greater than an inner diameter of each of the through holes of the wiring board. Alternatively, the solid solder may have a tapered shape so that a tapered portion is inserted into each of the through holes of the wiring board.

Additionally, there is provided according to another aspect of the present invention a wiring board on which a semiconductor device is mounted, the wiring board comprising:

a top surface and a bottom surface opposite to the top surface, the top surface facing the semiconductor device when the semiconductor device is mounted on the wiring board;

a through hole provided between the top surface and the bottom surface;

a conductive member formed on an inner surface of the through hole so that the conductive member is soldered to a terminal of the semiconductor device, an end of solder being observable from the side of the bottom surface when the semiconductor device is mounted on the wiring board.

According to this invention, a solder is provided inside the conductive member formed on the inner surface of the through hole when the conductive member is soldered to the terminal of the semiconductor device. A level of an end of the solder in the conductive member varies in accordance with a soldered state of the conductive member. Thus, the soldered state as to whether it is good or not good can be determined by observing the state of the solder in the conductive member. This achieves an easy inspection of the soldered state. The wiring board may further comprise a solid solder provided in the through hole. The solid solder may have a maximum dimension greater than an inner diameter of the conductive member.

Additionally, there is provided according to another aspect of the present invention a wiring board on which a semiconductor device is mounted, the wiring board comprising:

a plurality of terminals soldered to respective terminals of the semiconductor device when the semiconductor device is mounted on the wiring board; and a plurality of light reflecting members provided on a surface of the wiring board, the light reflecting members reflecting respective light beams incident thereon so that a deformation of the wiring board is detected based on deflection of the reflected light beams.

According to this invention, a soldered state of the soldering bumps as to whether it is good or not good can be determined based on a magnitude of a deformation of the wiring board. Thus, an easy inspection of the soldered state can be performed with a high accuracy.

Other objects, features and advantages of the present invention will become more apparent from the following detailed description when read in conjunction with the accompanying drawings.

BRIEF DESCRIPTION OF THE DRAWINGS

FIG. 12 is an illustration of various soldered states of a soldering bump and corresponding X-ray transmission images;

FIG. 13A is an enlarged cross-sectional view of a part of a third embodiment in which a bump is provided; FIG. 13B is a plan view of the part shown in FIG. 13A;

FIGS. 25A–25C are illustrations of various soldered states;

FIG. 31 is a cross-sectional view showing a surrounding area of the part shown in FIG. 29;

FIG. 32 is a graph showing a result of measurements taken at measurement points shown in FIG. 31;

DETAILED DESCRIPTION OF THE PREFERRED EMBODIMENTS

Figure 1:
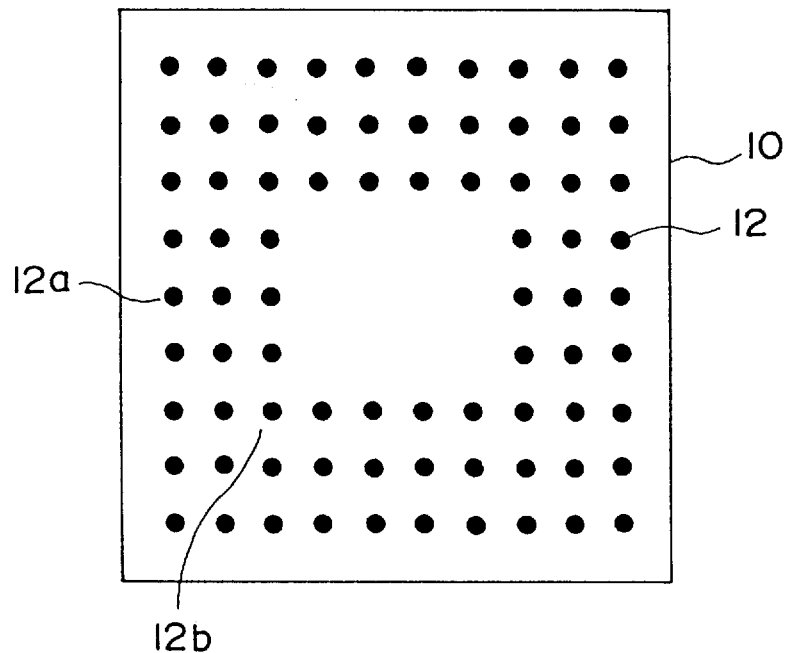
FIG. 1 is a plan view of a bottom surface of a package of a conventional BGA-type semiconductor device.
Figure 2:
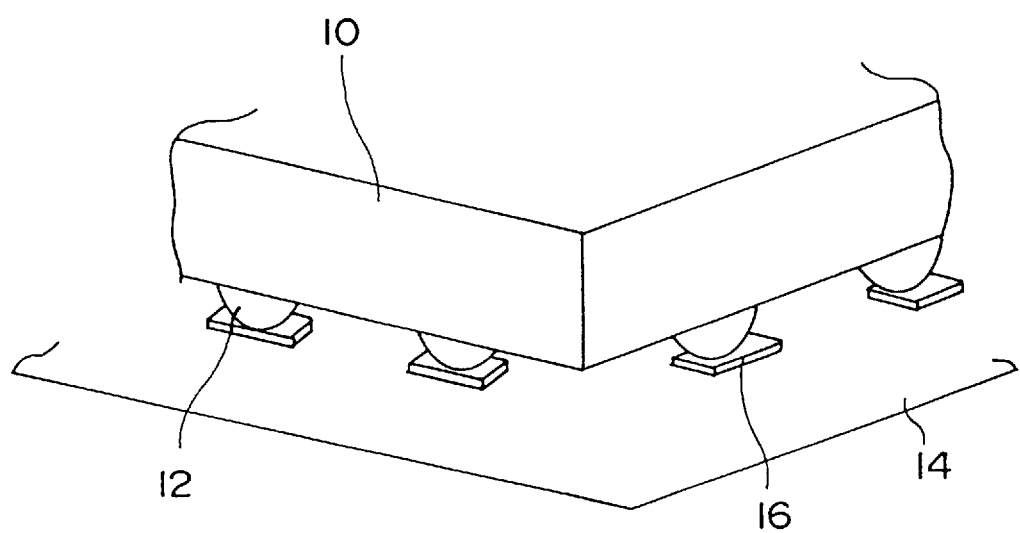
FIG. 2 is a perspective view of a part of the package of the BGA-type semiconductor device shown in FIG. 1 when the semiconductor device is placed on a wiring board.
Figure 3:
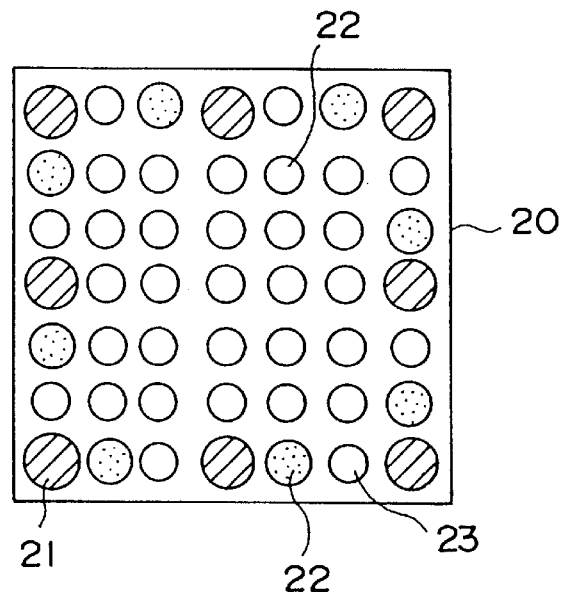
FIG. 3 is a plan view of a bottom surface of a package of a BGA-type semiconductor device according to the first embodiment of the present invention.
Figure 4:
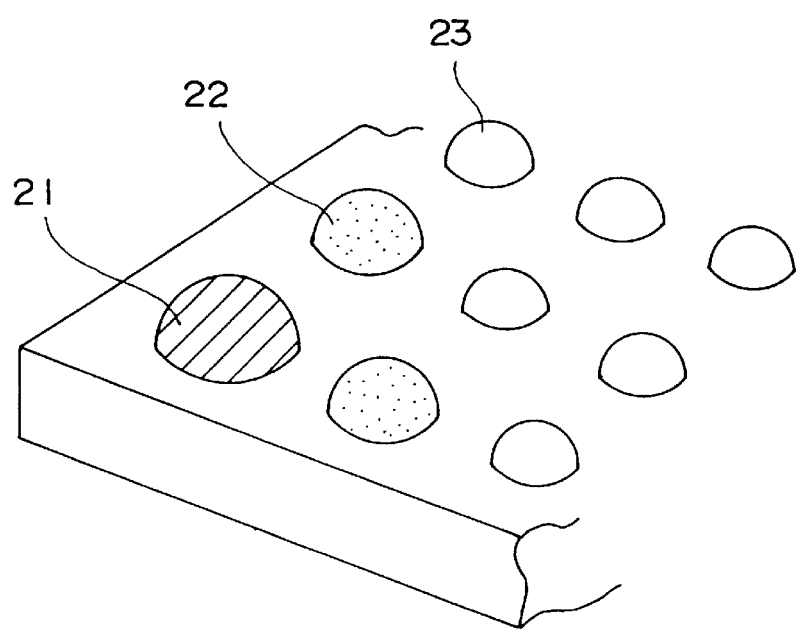
FIG. 4 is a perspective view of a part of the bottom surface of the package shown in FIG. 3.
Figure 5:
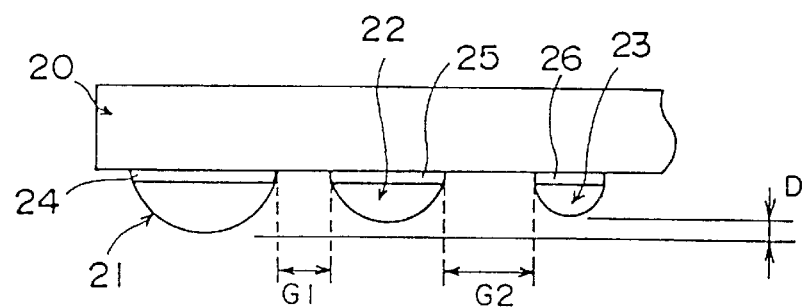
FIG. 5 is a side view of a part of the package shown in FIG. 3.

A description will now be given of a first embodiment of the present invention. FIG. 3 is a plan view of a bottom surface of a package 20 of a BGA-type semiconductor device according to the first embodiment of the present invention. FIG. 4 is a perspective view of a part of the bottom surface of the package 20 shown in FIG. 3. FIG. 5 is a side view of a part of the package 20 shown in FIG. 3.

The first embodiment features three different size soldering bumps 21, 22 and 23 provided on an outermost part of the bottom surface of the package 20. The three different size soldering bumps 21, 22 and 23 are consecutively arranged in that order. A size of each footprint provided on a wiring board, on which the BGA-type semiconductor device is mounted, is uniform, and the same amount of solder paste is applied onto each footprint.

The package 20 is formed of a glass-epoxy resin. The soldering bump 21 is largest among the three soldering bumps 21, 22 and 23. Hereinafter, the soldering bump 21 is referred to as a large bump. The soldering bump 23 is smallest among the three soldering bumps 21, 22 and 23. Hereinafter, the soldering bump 23 is referred to as a small bump. The soldering bump 22 has a medium size which is between the large bump 21 and the small bump 23. Hereinafter, the soldering bump 22 is referred to as a standard bump. The outermost soldering bumps located on an outermost area of the bottom surface include the large bump 21, the standard bump 22 and the small bump 23, sequentially arranged in that order. The soldering bumps other than the outermost bumps are the standard bumps.

Figure 6:
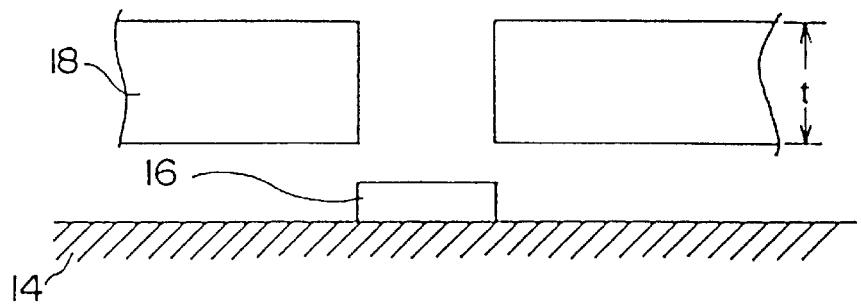
FIG. 6 is an illustration for explaining an application of solder paste.

The sizes of the three soldering bumps 21, 22 and 23 are determined by a thickness of a solder paste applied onto each footprint 16 provided on the wiring board 14 (refer to FIG. 6). If the standard bump 22 has a diameter (the maximum diameter) of 0.7 mm and a height of 0.35 mm, the solder paste is applied onto the footprint 16 by using a metal mask having a thickness t of about 2.0 mm (refer to FIG. 6). In this case, a thickness of solder film after the solder reflowing process is about 0.1 mm. Accordingly, in this case, the difference in height between the large bump 21 and the small bump 23 should be less than 0.1 mm.

As shown in FIG. 5, sizes of lands 24, 25 and 26 differ according to the sizes of the soldering bumps 21, 22 and 23. Since the distances between the centers of bumps are the same, gaps G1 and G2 between the bumps are different.

The following table shows an example of the sizes of the bumps 21, 22 and 23.

|               | dia.    | height  | gap          |
|---------------|---------|---------|--------------|
| Standard Bump | 0.7 mm  | 0.35 mm | —            |
| Large Bump    | 0.8 mm  | 0.40 mm | 0.20 mm (G1) |
| Small Bump    | 0.6 mm  | 0.30 mm | 0.47 mm (G2) |

In this embodiment, a soldered state of the soldering bumps located inside the outermost bumps is determined by checking three soldering bumps 21, 22 and 23 located in the outermost area of the bottom surface. That is, if it is determined that the soldered state of the outermost bumps 21, 22 and 23 is bad, the soldered state of the soldering bumps other than the outermost bumps is determined as being bad since the probability of the soldering bumps other than the outermost bumps being bad is high.

A description will now be given of an inspection performed on the soldered state.

Figure 7:
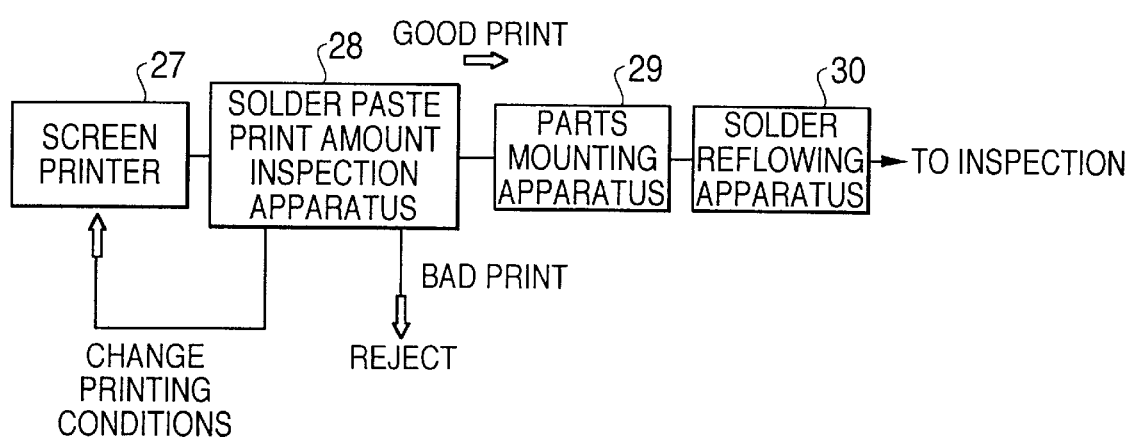
FIG. 7 is a diagram for explaining soldering and inspection.

A procedure of soldering and inspection of the soldered state is shown in FIG. 7. A solder paste is applied on the wiring board by using a screen printer 27. The amount of solder paste is checked by a solder paste print amount inspection apparatus 28 whether or not a thickness of the solder paste is appropriate and uniform. This is because, as discussed above, the soldered state of all the soldering bumps is determined by the soldered state of the outermost bumps.

Figure 8A:
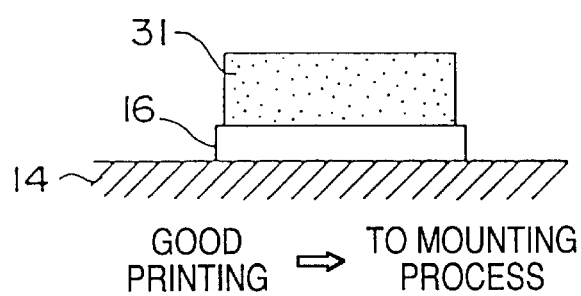
FIG. 8A is an illustration for explaining a soldered state where a solder paste is appropriately applied on a footprint.
Figure 8B:
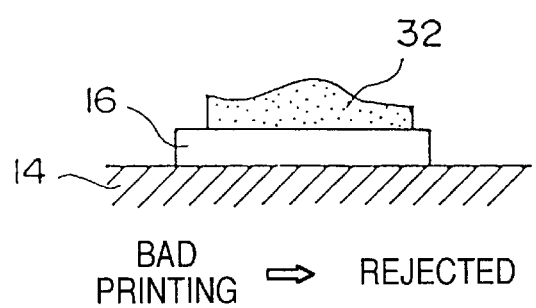
FIG. 8B is an illustration for explaining a soldered state where a solder paste is not applied on the footprint in a good condition.

FIG. 8A shows a soldered state where the solder paste 31 is appropriately applied on the footprint 16. FIG. 8B shows a soldered state where the solder paste 32 is not applied on the footprint 16 in a good condition. The solder paste 31, which is in a good condition, has a predetermined thickness and a flat top surface as shown in FIG. 8A. If it is determined that the solder paste is in the good condition, the wiring board 14 is supplied to a parts mounting apparatus 29 as shown in FIG. 7. If the solder paste is determined to be in the condition of the solder paste 32 which has an uneven thickness and a wavy top surface, the wiring board 14 is rejected. If the rejection occurs, printing condition of the screen printer 27 is changed to correct the thickness and flatness of the solder paste on the footprint 16. The correction is performed, for example, by adjusting a squeezing speed and a squeezing pressure of a squeezer of the screen printer 27. As mentioned above, shown in FIG. 8A, the solder paste is applied onto the footprint 16 in a good condition. This ensures the good soldered state of the solder bumps other than the outermost bumps by checking only the soldered state of the outermost bumps.

The BGA-type semiconductor device is then mounted on the wiring board 14 by the parts mounting apparatus 29. The soldering bumps are soldered onto the footprints 16 of the wiring board 14 by a solder reflowing apparatus 30. The soldered wiring board 14 having the BGA-type semiconductor device is proceeded to an inspection process described below.

Figure 9A:
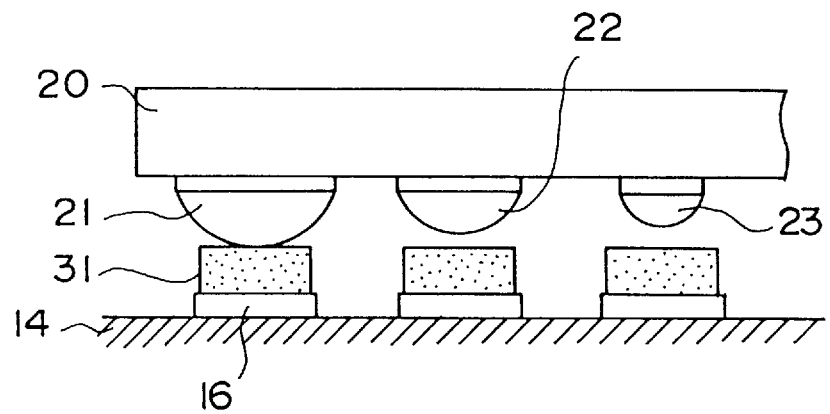
FIG. 9A is a side view of a part of a package placed on the wiring board.
Figure 9B:
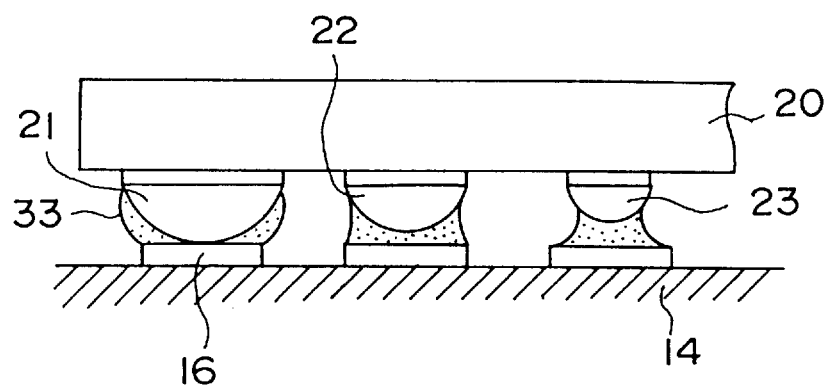
FIGS. 9B and 9C are side views of a part of the package after the solder reflowing process is performed.
Figure 9C:
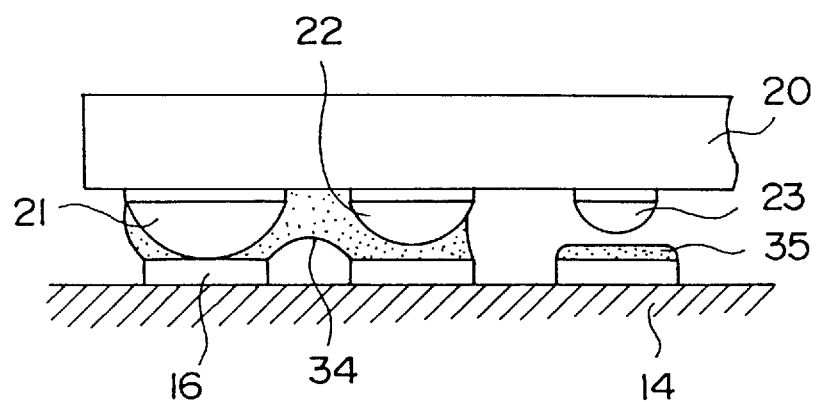

FIG. 9A is a side view of a part of the package 20 placed on the wiring board 14. The solder reflowing process is performed in this state. FIGS. 9B and 9C are side views of a part of the packages 20 after the solder reflowing process is performed. As shown in FIG. 9B, a solder fillet 33 of the large bump 21 is formed which protrudes outside the footprint 16. Thus, the gap between the solder fillet 33 and the adjacent standard bump 22 is small. However, if a solder bridge 34 shown in FIG. 9C is not formed between the large bump 21 and the standard bump 22, it can be determined that the solder bumps other than the outermost bumps are in a good condition. This is because the solder bumps other than the outermost bumps have the same size as that of the standard bump 22 and thus distances between the solder bumps other than the outermost bumps are greater than the distance between the large bump 21 and the standard bump 22 in which the solder bridge 34 is formed. Additionally, if the small bump 23 is soldered in a good condition as shown in FIG. 9B, it can be determined that all of the soldering bumps are soldered in a good condition since the soldering bumps other than the outermost bumps have a height greater than the small bump 23. Accordingly, if a non-contact solder paste 35 shown in FIG. 9C is found in the outermost bumps, it is determined that there is a possibility of occurrence of the non-contact solder paste in the solder paste of other than the outermost bumps.

It should be noted that bumps having different sizes may be provided in other than the outermost area as long as the soldered state of the bumps can be checked by visual inspection from outside. Additionally, the bumps having a size different from the standard bump may be provided as dummies for inspection.

Figure 10A:
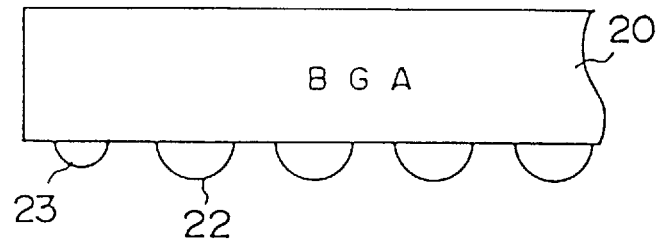
FIG. 10A is a side view of a variation of the first embodiment of the present invention.
Figure 10B:
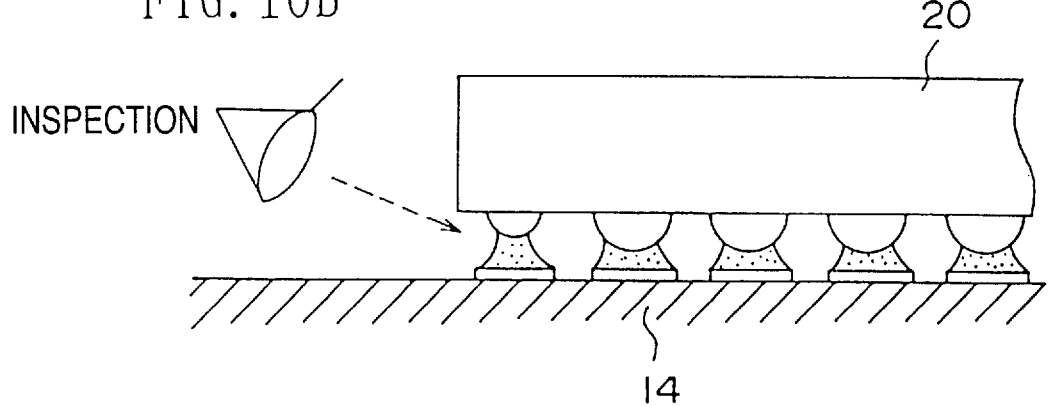
FIG. 10B is a side view of the variation shown in FIG. 10A after a solder reflowing process is performed.

FIG. 10A is a side view of a variation of the first embodiment of the present invention. FIG. 10B is a side view of the variation shown in FIG. 10A after a solder reflowing process is performed. In this variation, the large bump 21 is not provided. That is, only the small bump 23 is provided in the outermost area of the bottom surface of the package 20. The soldering bumps other than the outermost bumps are the standard bumps similar to the first embodiment. In this variation, if the small bump 23 is soldered in a good condition, it can be determined that all of the soldering bumps are soldered, that is, it can be determined that the non-contact solder paste has not occurred. Since this variation does not use the large bump 23, accuracy of inspection is not as high as that of the above-mentioned first embodiment. However, by using this variation, an easy inspection can be achieved for determining a connection quality of the terminals (bumps) with the wiring board 14.

Figure 11:
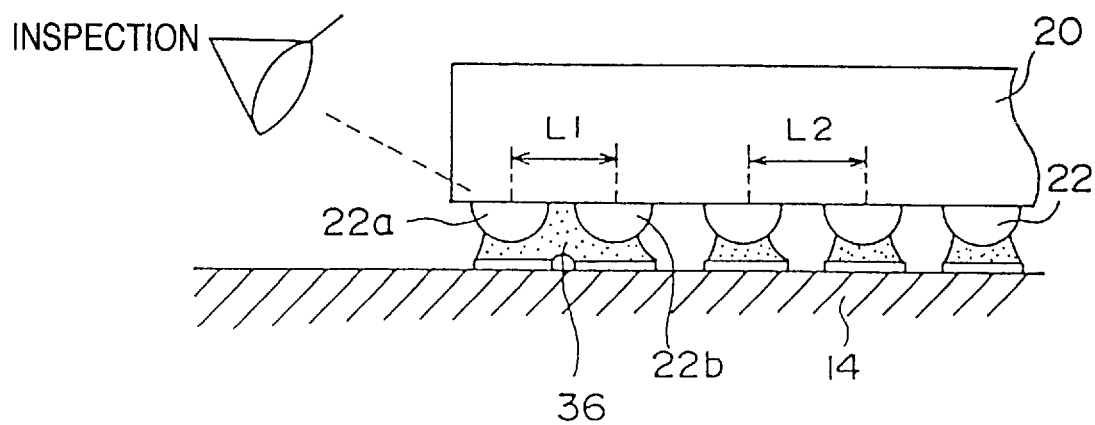
FIG. 11 is a side view of a package according to a second embodiment of the present invention.

FIG. 11 is a side view of the package 20 according to a second embodiment of the present invention. In the second embodiment, all the soldering bumps are the standard bumps 22. Some of the soldering bumps 22a and 22b adjacent to each other among the outermost bumps are located so that the distance L1 between the soldering bumps 22a and 22b is less than a distance L2 between other adjacent soldering bumps 22. If a solder bridge is formed between the solder bumps 22a and 22b, it is determined that there is a possibility of forming a solder bridge between other solder bumps. The accuracy of inspection of the second embodiment is not as high as that of the first embodiment. However, by using the second embodiment, an easy inspection can be achieved for determining a connection quality of the terminals (bumps) with the wiring board 14.

A description will now be given of a third embodiment of the present invention. The third embodiment is a BGA-type semiconductor device which can improve an accuracy of inspection for checking a connection state of soldered parts in the conventional X-ray transmission image method.

FIG. 12-(a) shows various soldered states of a soldering bump, and FIG. 12-(b) shows corresponding X-ray transmission images. In FIG. 12-(a), an X-ray is projected in a direction indicated by an arrow X. As shown in FIG. 12-(b), an area in which a solder exists is projected as a circular shadow. Thus, the state of soldered portion cannot be checked.

Figure 14:
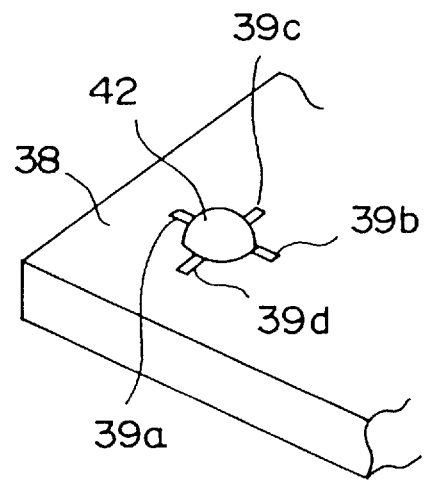
FIG. 14 is a perspective view of the part shown in FIG. 13A.

FIG. 13A is an enlarged cross-sectional view of a part of the third embodiment in which a bump 42 is provided. FIG. 13B is a plan view of the part shown in FIG. 13A. FIG. 14 is a perspective view of the part shown in FIG. 13A. The bump 42 is formed on a bottom surface of a package 38 made of a glass-epoxy resin. A through hole 37 is formed in the package 38. A conductive member 39 made of such as copper is formed through the through hole 37. A ring-like land is formed as a part of the conductive member 39 on the bottom surface of the package 38. Additionally, four orthogonal patterns (may be referred to as inspection patterns) 39a, 39b, 39c and 39d are extended from the land. The soldering bump 42 comprises a core 40 made of copper covered with a plate layer 41 made of Ni—Au. The core 40 extends inside the through hole 37. The plate layer 41 is provided for preventing an oxidation of the copper core 40.

A diameter D1 of the soldering bump 42 is smaller than a distance D2 between ends of the opposite inspection patterns, for example, the inspection patterns 39a and 39b. For example, the distance D1 is 0.7 mm while the distance D2 is 1.0 mm. A length L3 of each of the inspection patterns 39a to 39d is, for example, 0.15 mm, and a width W1 is 0.3 mm.

The inspection patterns 39a–39d function to improve an accuracy of inspection using the X-ray transmission image. The bump 42 having the above-mentioned inspection patterns 39a–39d is provided on an outermost area of the bottom surface of the package 38.

Figure 15:
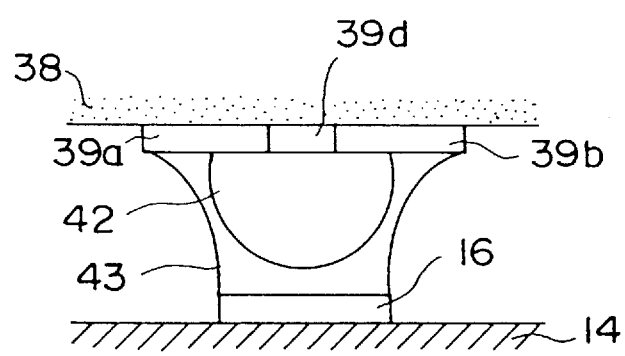
FIG. 15 is a side view of a soldering bump soldered on a footprint of a wiring board by a solder reflowing process.

FIG. 15 is a side view of the soldering bump 42 soldered on the footprint 16 of the wiring board 14 by the solder reflowing process. A solder fillet 43 is formed between the soldering bump 42 and the footprint 16 of the wiring board 14. When the soldered state is in a normal condition, the solder fillet 43 extends to the inspection patterns 39a–39d. The soldered state of the soldering bumps is determined by observing the formation of solder on the inspection patterns 39a–39d by the X-ray transmission image.

Figure 16A:
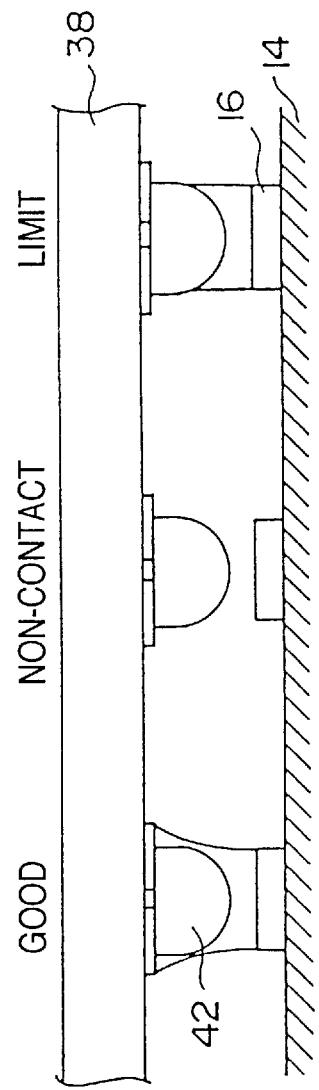
FIG. 16A is a side view showing various soldered states of the soldering bump.
Figure 16B:
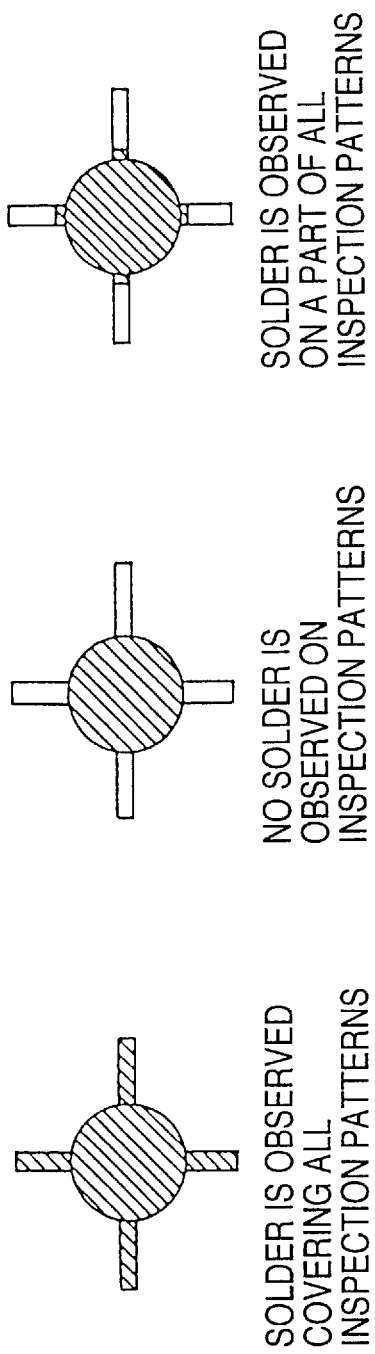
FIG. 16B is X-ray transmission images corresponding to the soldered states shown in FIG. 16A.

FIG. 16A shows various soldered states of the soldering bump 42. FIG. 16B shows X-ray transmission images corresponding to the soldered states shown in FIG. 16A. When the soldered state is good, the solder flows to each of the inspection patterns 39a–39d. Thus, solder can be observed on each of the inspection patterns 39a–39d in the X-ray transmission image as shown in the left-side image of FIG. 16B. When the soldered state is bad, that is, the non-contact solder paste occurs, no solder is observed on each of the inspection patterns 39a–39d as shown in the center X-ray transmission image of FIG. 16B. When the solder is observed on at least a part of each of the inspection patterns 39a–39d, the soldered state can be determined as a good condition. This case is shown in the right-side image of FIG. 16B as a limit of a good soldered state.

Figure 17A:
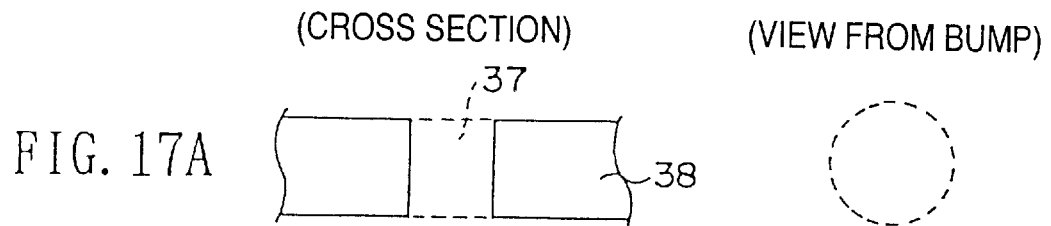
FIGS. 17A–17D are illustrations for explaining a manufacturing process of inspection patterns.
Figure 17B:
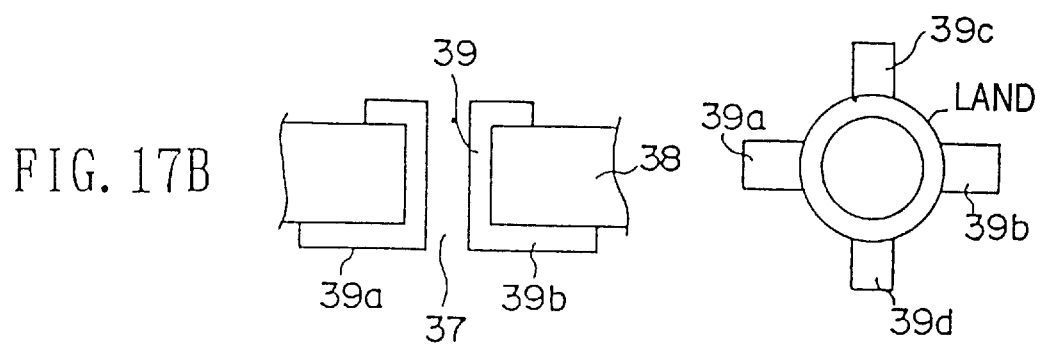
Figure 17C:
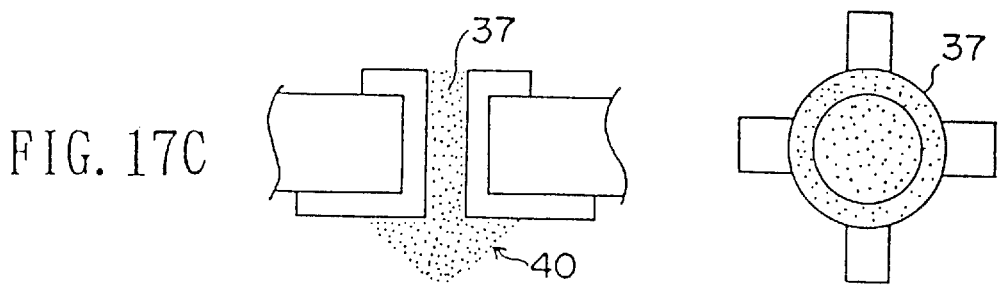
Figure 17D:
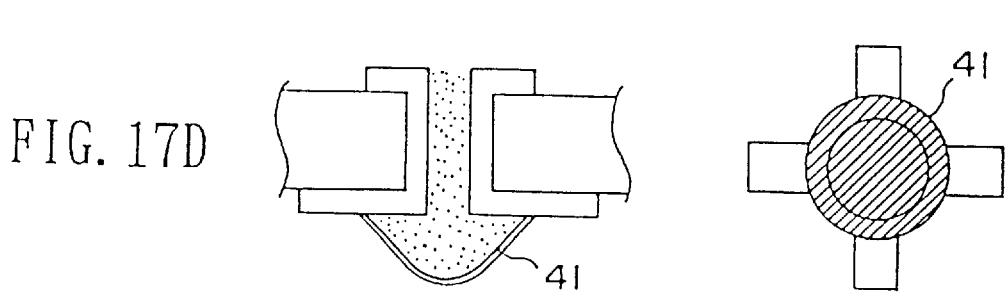

FIGS. 17A–17D are illustrations for explaining a manufacturing process of the inspection patterns 39a–39d. As shown in FIG. 17A, the through hole 37 is formed in the package 38 by an appropriate boring jig. Then, as shown in FIG. 17B, a conductive material such as copper is plated on an inner surface of the through hole 37 and the top and bottom surfaces of the package 38. The conductive material formed on the bottom surface is patterned so as to form the land and the inspection patterns 39a–39d. Thereafter, as shown in FIG. 17C, a conductive material such as copper is provided inside the through hole 37 and on the land so as to form the core 40. The Ni—Au layer 41 is plated on the core 40 as shown in FIG. 17D.

Figure 18:
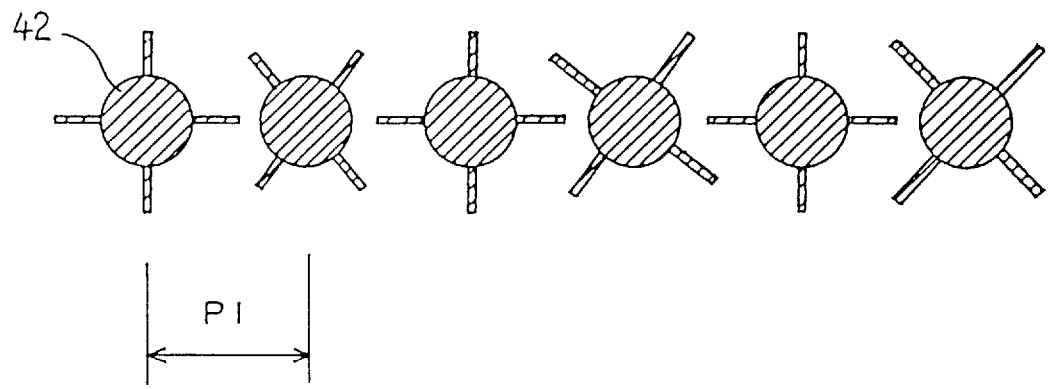
FIG. 18 is an illustration for explaining an example of an arrangement of inspection patterns shown in FIGS. 13A and 13B.

In order to reduce a pitch P1 between the soldering bumps 42, the inspection patterns may be arranged as shown in FIG. 18. That is, the inspection patterns of the adjacent soldering bumps are rotated 45 degrees with respect to each other. In this arrangement, the pitch can be reduced to P1=0.65 mm.

Figure 19:
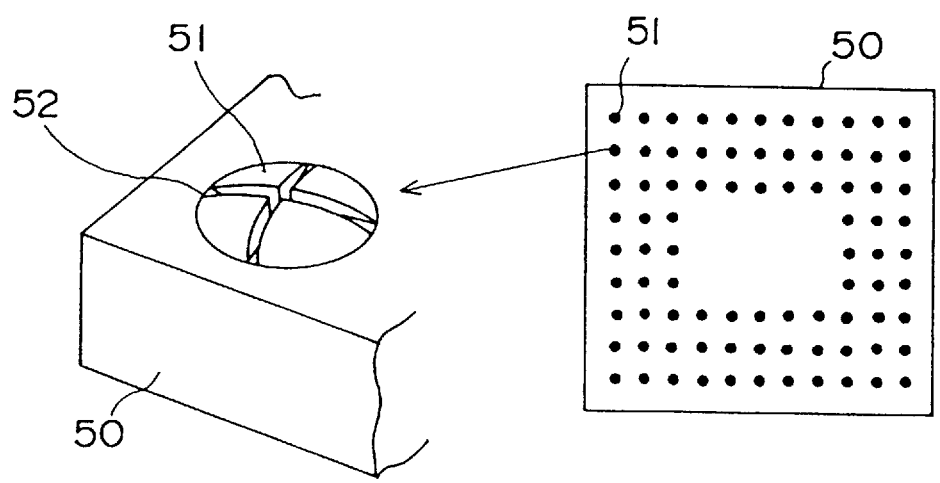
FIG. 19 is an illustration for explaining a soldering bump formed on a package of a BGA-type semiconductor device according to a fourth embodiment of the present invention.

A description will now be given of a fourth embodiment of the present invention. FIG. 19 is an illustration for explaining a soldering bump 51 formed on a package 50 of a BGA-type semiconductor device according to the fourth embodiment of the present invention. In the fourth embodiment, the soldering bump 51 has a cross-shaped slit 52. The soldering bumps 51 are provided on an outermost area of a bottom surface of the package 50. Soldering bumps other than the outermost bumps 51 do not have the slit 52. When the soldering is in a good condition, the melted solder enters into the slit 52 and forms a solder fillet. A condition of the soldered state can be checked by observing the state of the solder fillet formed by the slit 52.

Figure 20A:
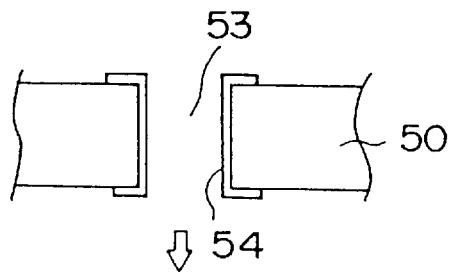
FIGS. 20A–20C are illustrations for explaining a manufacturing process of a soldering bump in the fourth embodiment.
Figure 20B:
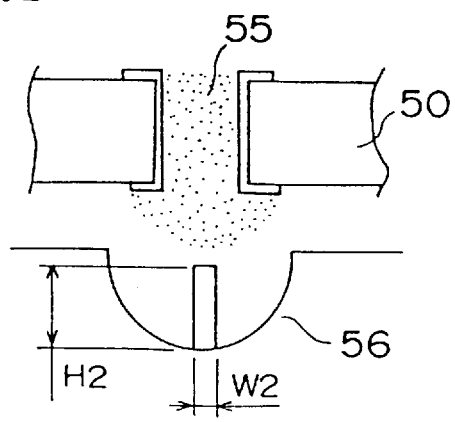
Figure 20C:
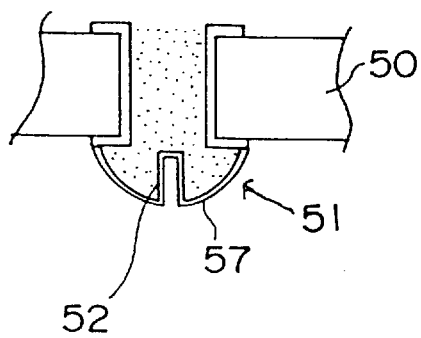

FIGS. 20A–20C are illustrations for explaining a manufacturing process of the soldering bump 51. As shown in FIG. 20A, a through hole 57 is formed in the package 50, and a conductive material such as copper is plated on an inner surface of the through hole 53 and top and bottom surfaces of the package 50. The conductive material layer is shaped by patterning to form a conductive pattern 54. Thereafter, as shown in FIG. 20B, a conductive material such as copper is filled in the through hole 53 to make a core 55. Then, a mold 56 having a protrusion having a shape corresponding to the cross-shaped slit 52 is pressed onto the core 55. Thus, the cross-shaped slit 52 having a depth H2 and a width W2 is formed on the core 55. Thereafter, a Ni—Au layer 57 is plated on the core 55 to complete the soldering bump 51.

Figure 21:
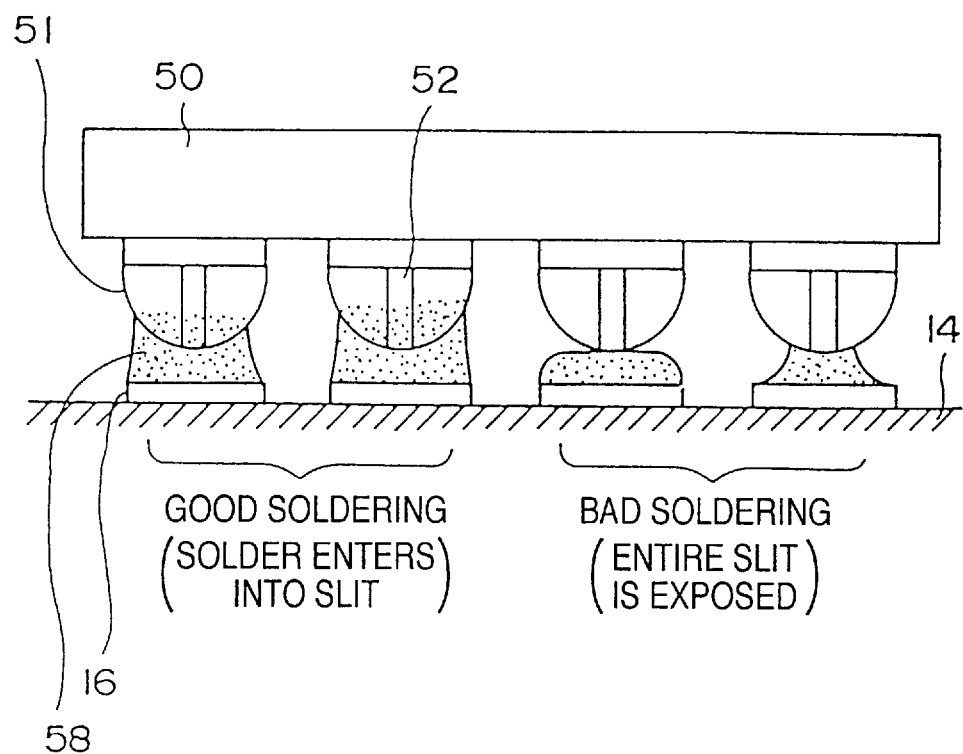
FIG. 21 is an illustration for explaining a checking of a soldered state of a soldering bump in the fourth embodiment.

FIG. 21 is an illustration for explaining a checking of the soldered state in the fourth embodiment. If the soldering is in a good condition, a solder fillet 58 is formed inside the slit 52 as well as around an outer surface of the soldering bump 51. On the other hand, if the soldering is in a bad condition, the solder does not enter into the slit 52, and thus the entire slit 51 is observed. Accordingly, the soldered state of the soldering bumps can be checked with a high accuracy.

It should be noted that since the solder enters into the slit 52, the contact area between the solder and the soldering bump 51 is increased. This results in a strong soldering of the soldering bump 51.

Figure 22:
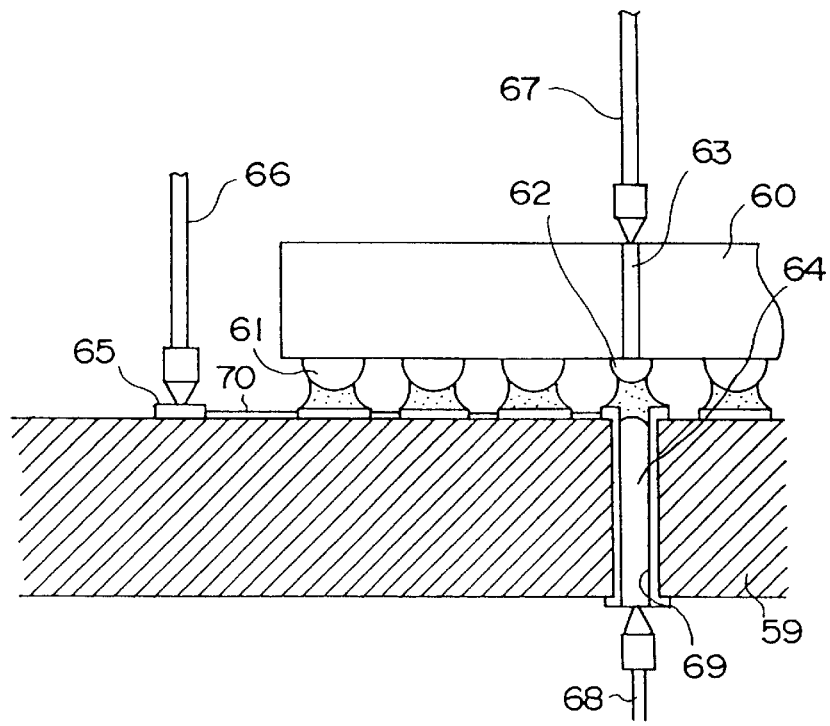
FIG. 22 is an illustration for explaining a checking of a soldered state of a semiconductor device according to a fifth embodiment of the present invention.

A description will now be given, with reference to FIG. 22, of a fifth embodiment of the present invention. FIG. 22 is an illustration for explaining a checking of a soldered state of a semiconductor device according to the fifth embodiment of the present invention. In the fifth embodiment, a small-sized soldering bump 62 is provided in a position where a bad soldering may occur due to a warp of a wiring board 59 or operational conditions of the soldering. The small-sized soldering bump 62 has a size smaller than the size of a regular soldering bump 61. That is, the small-sized soldering bump 62 has at least a height less than a height of the regular soldering bump 61. If the soldering of the small-sized soldering bump is in a good soldered state, it can be determined that the regular soldering bump 61 is also in a good soldered state.

In order to check the soldered state of the soldering bump 62, a footprint which is soldered to the soldering bump 62 is connected to a footprint 65 located outside a package 60 of the semiconductor device via an extension pattern 70. This allows an access of a probe 66 to the footprint 65.

The soldering bump 62 is connected to a conductive material provided in a through hole 63 so that a probe 67 can be electrically connected to the soldering bump 62. Additionally, in order to deal with the semiconductor device which does not have the through hole 63, the wiring board 59 has a through hole 64 under the footprint which is soldered to the soldering bump 62. A conductive material such as copper is provided inside the through hole 64 so that a probe 68 can be electrically connected to the footprint soldered to the soldering bump 62.

In this embodiment, by checking a continuity between the probe 67 and the probe 66 or 68, the soldered state of the soldering bump 62 can be checked. That is, the good soldering state of the regular soldering bump 61 can be determined by checking the continuity between the probe 67 and the probe 65 or 68.

Figure 23:
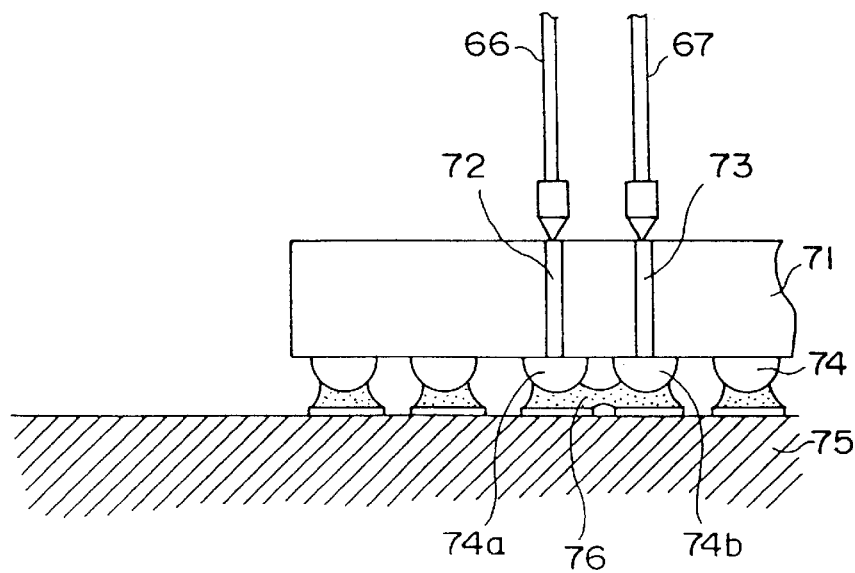
FIG. 23 is an illustration for explaining a checking of a soldered state of a semiconductor device according to a sixth embodiment of the present invention.

A description will now be given, with reference to FIG. 23, of a sixth embodiment of the present invention. FIG. 23 is an illustration for explaining a checking of a soldered state of a semiconductor device according to the sixth embodiment of the present invention. In the sixth embodiment, soldering bumps 74a and 74b are provided side by side with a pitch smaller than a regular pitch in a position where a bad soldering is may occur due to a warp of a wiring board 75 or operational conditions of the soldering. If it is determined that a solder bridge 76 is not formed between the solder bumps 74a and 74b, it can be determined that the soldered state of other soldering bumps 74 is in a good condition. It should be noted that, in this case, footprints corresponding to the soldering bumps 74a and 74b are arranged with a reduced pitch corresponding to the pitch between the soldering bumps 74a and 74b.

As shown in FIG. 23, the soldering bumps 74a and 74b are connected to conductive materials provided in through holes 72 and 73 formed in a package 71, respectively, from a top surface of the package 71. Thus, a probe 66 can be electrically connected to the soldering bump 74a via the conductive material in the through hole 72, and a probe 67 can be electrically connected to the soldering bump 74b via the conductive material in the through hole 73. If the solder bridge 76 is formed, the probe 66 is electrically connected to the probe 67. In such a case, it is determined that there is a possibility that a solder bridge is formed between other solder bumps 74. That is, if the solder bridge 76 is not formed between the solder bumps 74a and 74b, it can be determined that it is unlikely that a solder bridge is formed between other solder bumps.

Figure 24:
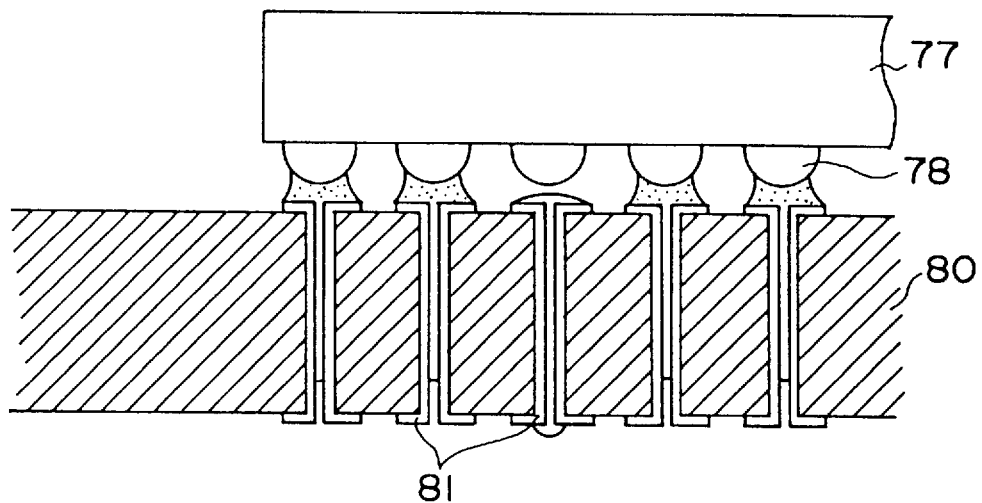
FIG. 24 is an illustration for explaining a checking of a soldered state of a semiconductor device according to a seventh embodiment of the present invention.

A description will now be given, with reference to FIG. 24, of a seventh embodiment of the present invention. FIG. 24 is an illustration for explaining a checking of a soldered state of a semiconductor device according to the seventh embodiment of the present invention. In the seventh embodiment, through holes 81 are formed under each footprint. A conductive material is provided on inner surface of each through hole 81. A soldered state of each soldering bump 78 provided on a package 77 of a semiconductor device can be checked by observing an amount of solder in the through hole 81.

FIGS. 25A–25C are illustrations of various soldered states of the soldering bump 78. FIG. 25A shows an example of a good soldered state. When the soldering bump 78 is soldered in the good soldered state, a solder fillet 82 is appropriately formed. In this condition, a level of the solder is at about the edge of the through hole 81 and is recessed into the through hole 81 as shown in FIG. 25A. In other words, an amount of solder applied on the footprint of the wiring board is controlled to achieve the above-mentioned state when the soldered state is good.

FIG. 25B shows an example of a bad soldered state in which a solder on the footprint is not in contact with the soldering bump 78. In this case, a solder protrudes from the through hole 81 since the solder fillet is not formed between the soldering bump 78 and the footprint. FIG. 25C is another example of a bad soldered state in which a solder bridge is formed between the adjacent soldering bumps 78. In this case, a level of the solder is lifted up into the inside of the through hole 81 since an amount of solder is used to form the solder bridge. Accordingly, the soldered states of the soldering bump can be checked by observing the solder in the through hole 81.

A description will now be given of an eighth embodiment of the present invention. The eighth embodiment is related to a BGA-type semiconductor device a soldered state of which is inspected by using an ultrasonic wave.

Figure 26:
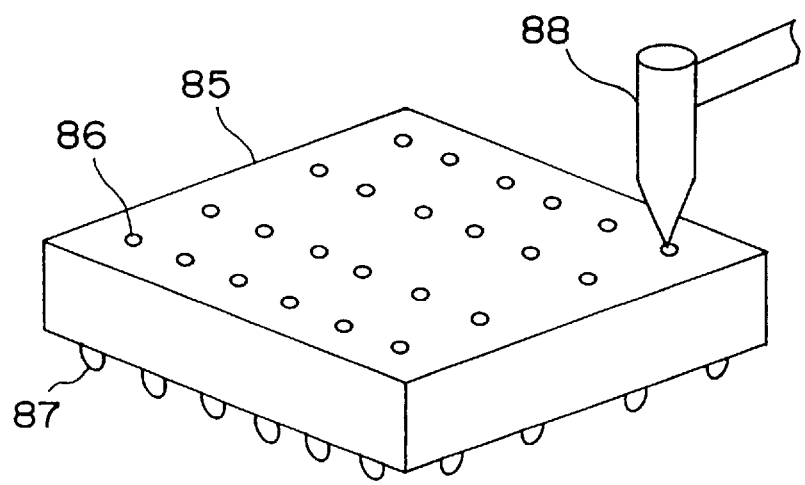
FIG. 26 is a perspective view of a BGA-type semiconductor device which is inspected by an ultrasonic method.
Figure 27:
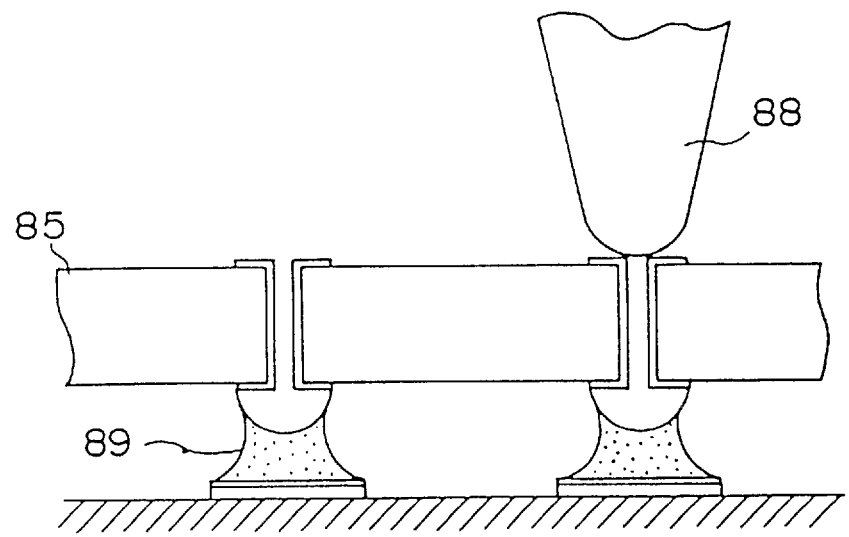
FIG. 27 is an enlarged cross-sectional view of a part of the semiconductor device shown in FIG. 26.

FIG. 26 is a perspective view of the BGA-type. semiconductor device which inspected by the ultrasonic method. FIG. 27 is an enlarged cross-sectional view of a part of the semiconductor device shown in FIG. 26. An ultrasonic probe 88 is pressed against a land of a conductive member provided in a through hole 86 formed in a package 85 of the BGA-type semiconductor device. An ultrasonic wave is transmitted to a solder fillet 89 via the conductive member and a soldering bump 87. A reflected energy of the ultrasonic wave is measured to check a soldered state, that is, a state of the solder fillet formed under the soldering bump 87.

Figure 28:
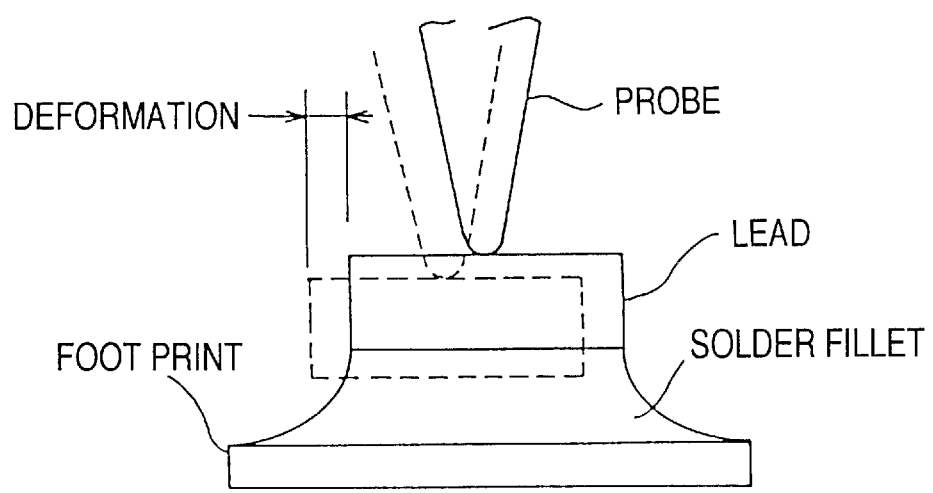
FIG. 28 is an illustration for explaining a principle of the ultrasonic method.

FIG. 28 is an illustration for explaining a principle of the ultrasonic method. In FIG. 28, an ultrasonic probe is pressed against a lead with a predetermined pressing force. An ultrasonic wave is transmitted by the ultrasonic probe. The ultrasonic wave oscillates a solder fillet under the lead, and returns to the ultrasonic probe by being reflected by a footprint. The energy of the reflected ultrasonic wave is dependent on an amount of deformation of solder forming the solder fillet. A characteristic of the reflected ultrasonic wave is measured beforehand. If the measured ultrasonic wave does not correspond to the characteristic measured beforehand, it can be determined that the soldered state is not good.

In the above-mentioned method, if the solder fillet is not influenced by the surrounding area, the determination can be made with a high accuracy. However, in practice, many noises are received by the ultrasonic probe since a plurality of soldering bumps are provided in the vicinity of the measured part. That is, a part of the ultrasonic wave is transmitted to and reflected by other soldering bumps surrounding the measured soldering bump. The eighth embodiment has a structure to eliminate this problem.

Figure 29:
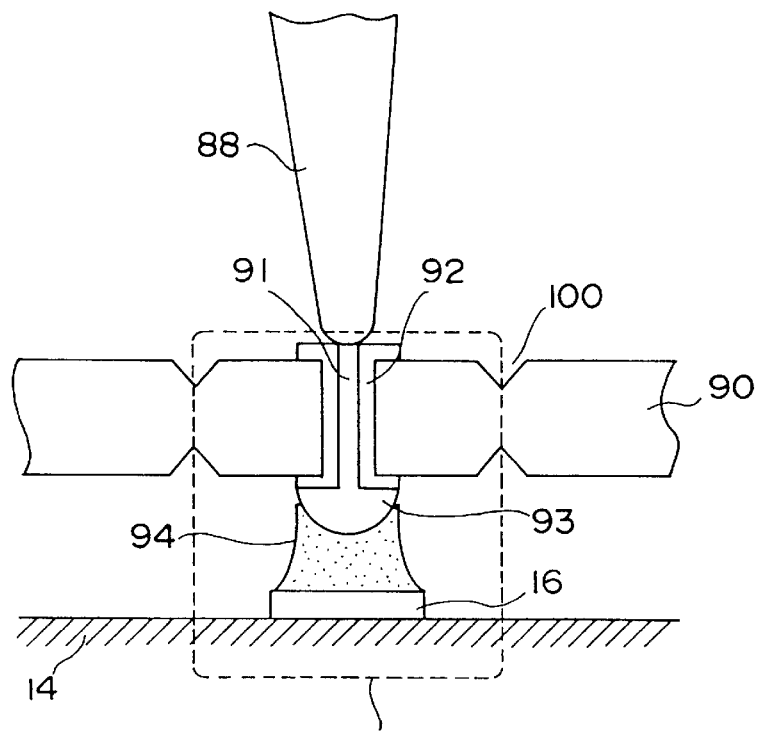
FIG. 29 is a cross-sectional view of a part of a BGA-type semiconductor device according to an eighth embodiment of the present invention.
Figure 30:
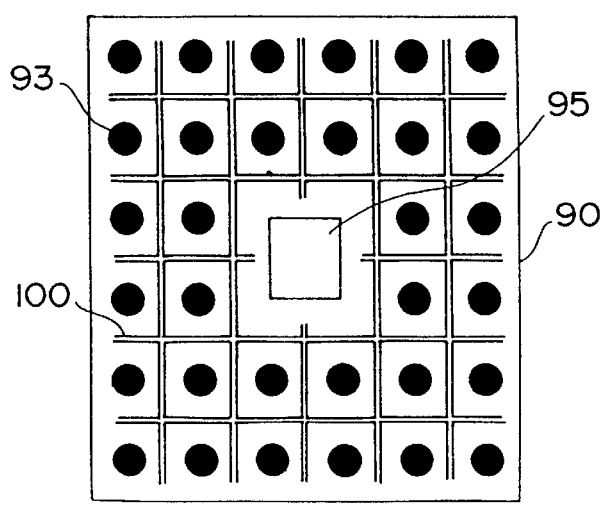
FIG. 30 is a plan view of a bottom surface of a package of the semiconductor device shown in FIG. 29.

FIG. 29 is a cross-sectional view of a part of a BGA-type semiconductor device according to the eighth embodiment of the present invention. FIG. 30 is a plan view of a bottom surface of a package 90 of the semiconductor device shown in FIG. 29. FIG. 31 is a cross-sectional view showing a surrounding area of the part shown in FIG. 29.

The eighth embodiment features acoustical separation of each soldering bump 93 by a grid-like slit 100 formed on top and bottom surfaces of the package 90 as shown in FIG. 30. The slit 100 is not required to be formed in an area where the soldering bumps 93 are not provided. However, the slit 100 may be formed in this area if it is convenient for a manufacturing process.

In the ultrasonic method, the ultrasonic prove 88 is pressed against the land of the conductive member 92 in the through hole 91 corresponding to one of the soldering bumps 93 shown in FIG. 30. The slit 100 prevents the ultrasonic wave from being transmitted to adjacent soldered portions (solder bumps 93). A depth of the slit 100 is determined by various factors such as a type of material and a thickness of the package 90. For example, if the package 90 is made of a glass-epoxy and has a thickness of 1.9 mm, the slit 100 having a depth of 0.6 mm can acoustically separate each solder bump 93.

The measurement of the reflected ultrasonic wave is performed by pressing the probe 88 onto each conductive member 92 one after another. FIG. 32 is a graph showing a result of measurements taken at measurement points shown in FIG. 31. A reference value is determined by an impedance measured by a good soldered portion. An impedance greater than the reference value is determined as that obtained from a good soldered state. As shown in FIG. 32, impedances measured at the points 1, 2 and 4 are greater than the reference value. However, the impedance measured at the point 3 is below the reference value. Thus, it is determined that the soldered portion corresponding to the point 3 is in a bad soldered state. It should be noted that the impedance obtained from a non-contact soldered state is almost equal to the impedance of the package 90.

In the above-mentioned measurement, since each point is acoustically separated by the slit 100, an accurate determination can be made for the soldering state of each point.

A description will now be given of a ninth embodiment of the present invention. In the ninth embodiment, a wiring board has through holes and a ball-like solder (solder ball) is placed on each through hole instead of using a BGA-type semiconductor device having ball-like soldering bumps. By this structure, a manufacturing apparatus of the semiconductor device can be simplified, and the soldered state can be easily checked.

Figure 33A:
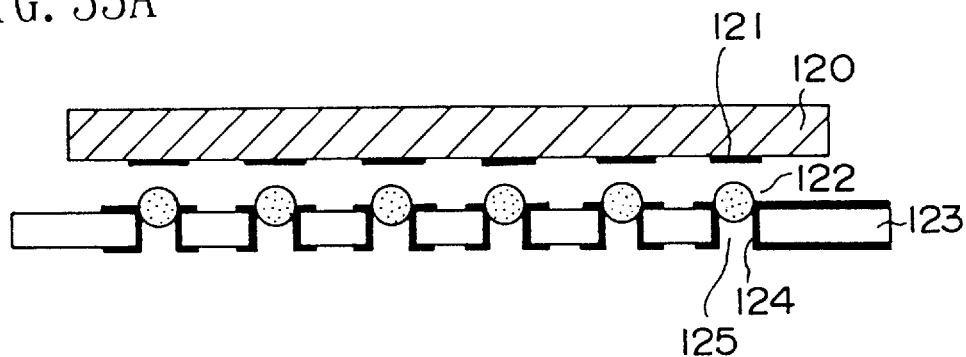
FIGS. 33A–33D are illustrations for explaining a ninth embodiment of the present invention.
Figure 33B:
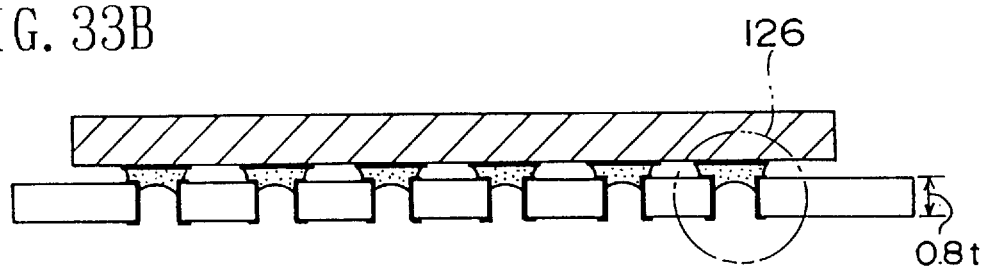
Figure 33C:
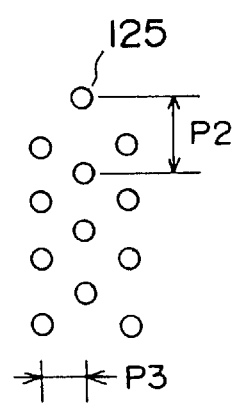

FIGS. 33A–33D are illustrations for explaining the ninth embodiment of the present invention. A semiconductor device according to the ninth embodiment has a package 120 having flat electrodes 121. Each flat electrode 121 is electrically connected to a semiconductor chip provided in the package 120. On the other hand, a wiring board 123 on which the semiconductor device is mounted has through holes 125 corresponding to the flat electrodes 121 of the semiconductor device. The through holes 125 are provided in a zigzag arrangement as shown in FIG. 33C so that the through holes 125 are arranged with a high space efficiency. A through hole electrode 124 is provided in each through hole 125. The through hole electrode 124 has a circular pattern formed on top and bottom surfaces of the wiring board 123. The circular pattern may be eliminated.

A diameter of the solder ball 122 is slightly greater than an inner diameter of the through hole electrode 124. For example, if the inner diameter of the through hole electrode 124 is 1.3 mm, the diameter of the solder ball 122 is about 1.6 mm. This is because the solder ball 122 is press fitted into the through hole electrode 124. The press fitted solder ball 122 partially protrudes from the top surface of the wiring board 123. Since the solder ball has ductility, the press fitting operation of the solder ball 122 be easily performed. The wiring board 123 may be heated when the press fitting operation is performed so that the press fitting operation is more easily performed. For example, if the solder ball 122 is made of eutectic solder $Sn_{60}Pb_{40}$, the wiring board 123 may be heated to about 100° C. since the melting point of $Sn_{60}Pb_{40}$ is 183° C. Other solders such as a high melting point solder $Sn_{90}Pb_{10}$ and a low melting point solder $SnPb+Bi_{15}$ may be used. Additionally, instead of heating the wiring board 123, flux may be applied inside the through hole electrode 124 so that the solder ball 122 is temporarily fixed by adhesion of the flux.

Figure 33D:
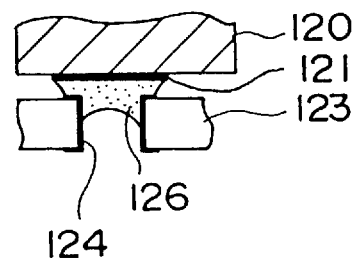

The semiconductor device is placed on the wiring board 123 in a state where the flat electrodes 121 are on the respective solder balls 122. The solder balls 122 are then melted by a solder reflowing process. FIG. 33D shows a state where the flat electrode 121 is soldered to the through hole electrode 124 by melting the solder ball 122. A solder fillet 126 is formed between the flat electrode 121 and the through hole electrode 124. The soldered state of each flat electrode 124 can be easily checked by observing the solder fillet 126 through the through hole electrode 124. In this embodiment, the semiconductor device does not need soldering bumps. Thus, an apparatus for making the soldering bumps is not needed for the present embodiment.

Figure 34A:
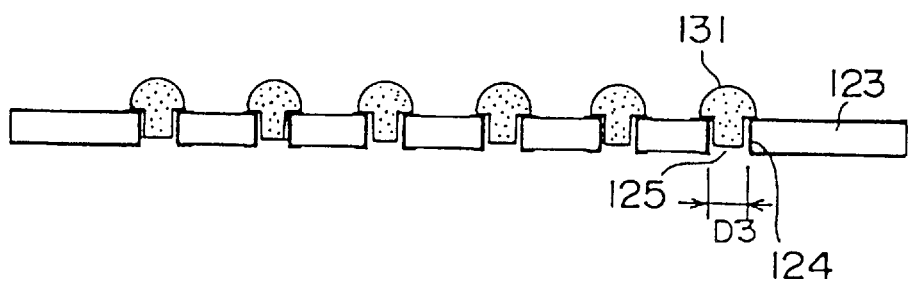
FIG. 34A is an illustration of a variation of the ninth embodiment of the present invention.
Figure 34B:
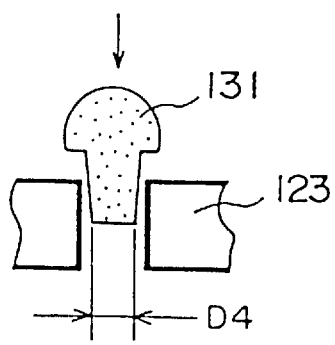
FIG. 34B is an enlarged view of one of solder balls shown in FIG. 34A.

FIG. 34A is an illustration of a variation of the ninth embodiment of the present invention. FIG. 34B is an enlarged view of one of solder balls shown in FIG. 34A. In this variation, a tapered solder ball 131 is used instead of the solder ball 122 shown in FIG. 33A. The maximum diameter of the tapered solder ball 131 is, for example, 1.2 mm. The minimum diameter D4 of a tapered part of the tapered solder ball 131 is 0.6 mm, and a diameter of a root of the tapered part is 0.9 mm. That is, the diameter of the root of the tapered part is greater than the inner diameter D3 of the through hole electrode 124.

Figure 35:
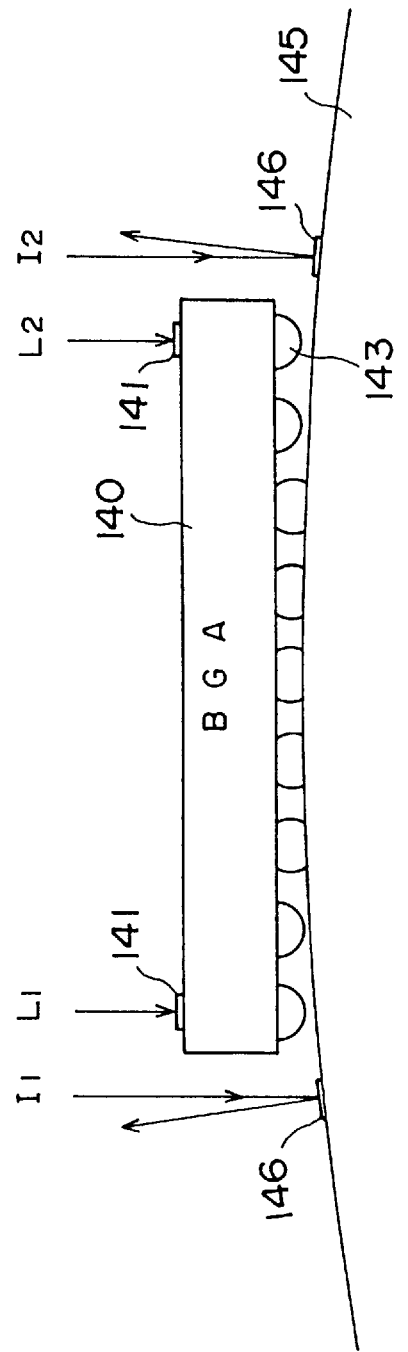
FIG. 35 is an illustration for explaining a structure of a tenth embodiment of the present invention.
Figure 36:
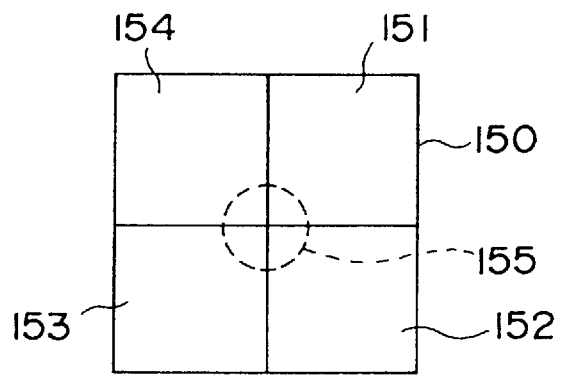
FIG. 36 is an illustration for explaining a quarter-split photodetector.

A description will now be given of a tenth embodiment of the present invention. FIG. 35 is an illustration for explaining a structure of the tenth embodiment. In this embodiment, a soldered state of a semiconductor device is assumed by detecting a warp of a wiring board or a warp of a package of the semiconductor device. As shown in FIG. 35, a package 140 of the semiconductor device has reflection parts 141 such as a pad made of copper and the like. The reflection part 141 is provided on four corners of a top surface of the package 140. Laser beams are projected to each of the reflection parts 141, and each of the reflected laser beams is received by a quarter-split photodetector 150 shown in FIG. 36. A deformation or a warp of the package 140 can be detected by an output of the quarter-split photodetector 150. If a deformation or a warp is detected in the package 140, it is determined that there is a possibility of an occurrence of a bad soldered state of soldered bumps provided on the package 140 as shown in FIG. 35.

The quarter-split photodetector 150 comprises four photodetector portions 151–154. If there is no deformation in the package 140, the laser beam reflected by the reflection part 141 is incident on the center area 155 of the photodetector portions 151–154 so that the laser beam is equally incident on the four photodetector portions 151–154. For example, in FIG. 35, the laser beams L1 and L2 incident on the respective reflection parts 141 are reflected by the reflection parts 141, and the reflected laser beams return along the same optical axes, respectively. However, if the package is deformed or warped, the reflected laser beams do not return along the same optical axes. Thus, the incident point of the reflected laser beam on the photodetector 150 is offset from the center. The offset is detected from outputs of the four photodetector portions 151–154. This detection is performed for each of the four reflection parts 141 provided on each corner of the top surface of the package 140 so as to detect a deformation or a warp of the package 140. The soldered state of the soldering bumps provided on the bottom surface of the package 140 can be assumed by a magnitude of the deformation or warp of the package 140.

Similar to the detection of deformation in the package 140, a deformation or a warp in the wiring board 145 is detected. As shown in FIG. 35, the wiring board 145 on which the semiconductor device is mounted has reflection parts 146 such as a pad made of copper and the like. It is preferable to provide the reflection part 146 correspondingly to each corner of the package 140. Laser beams are projected to each of the reflection parts 146, and each of the reflected laser beams is received by the quarter-split photodetector 150 shown in FIG. 36. A deformation or a warp of the wiring board 145 can be detected by an output of the quarter-split photodetector 150. If a deformation or a warp is detected in the wiring board 145, it is determined that there is a possibility of an occurrence of a bad soldered state of soldered bumps provided on the package 140 as shown in FIG. 35. If there is no deformation in the wiring board 145, the laser beams reflected by the respective reflection parts 146 are incident on the center area 155 of the photodetector portions 151–154 so that the laser beams are equally incident on the four photodetector portions 151–154. For example, in FIG. 35, the laser beams I1 and I2 incident on the respective reflection parts 146 are reflected by the reflection parts 146, and the reflected laser beams return along the same optical axes, respectively. However, if the wiring board 145 is deformed or warped as shown in FIG. 35, the reflected laser beams do not return along the same optical axes. Thus, the incident point of the reflected laser beam on the photodetector 150 is offset from the center. The offset is detected from outputs of the four photodetector portions 151–154. This detection is performed for each of the four reflection parts 146 corresponding to each corner of the top surface of the package 140 so as to detect a deformation or a warp of the wiring board 145. The soldered state of the soldering bumps provided on the bottom surface of the package 140 can be assumed by a magnitude of the deformation or warp of the wiring board 145.

The soldered state of the soldered bumps of the package 140 onto the wiring board 145 may be assumed by considering both of the deformations of package 140 and wiring board 145.

Figure 37:
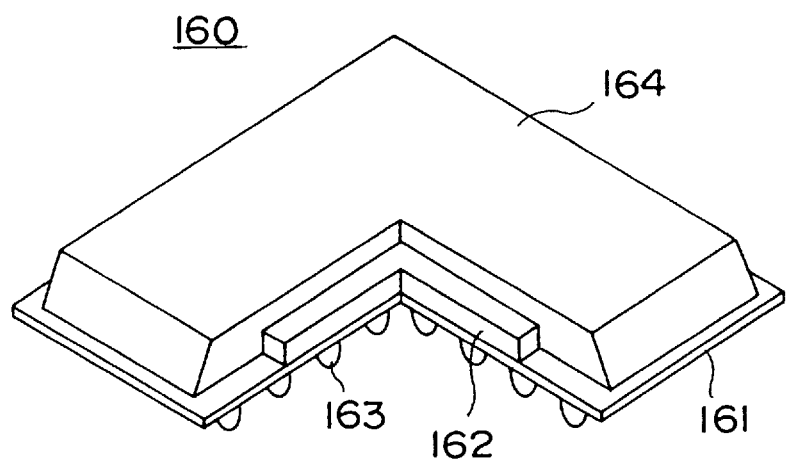
FIG. 37 is a partial cut-away perspective view of an example of a BGA-type semiconductor device according to the embodiments of the present invention.

FIG. 37 is a partial cut-away perspective view of an example of the BGA-type semiconductor device according to the previously discussed embodiments. A BGA-type semiconductor device 160 comprises a base 161 and a sealing portion 164 which together constitute a package. A semiconductor chip 162 is sealed within the sealing portion

164. Ball-like soldering bumps 163 are provided on a bottom surface of the base 161.

It is obvious for persons skilled in the art to combine any of the above-mentioned embodiments and variations so as to achieve the object of the present invention.

The present invention is not limited to the specifically disclosed embodiments, and variations and modifications may be made without departing from the scope of the present invention.

What is claimed is:

1. A semiconductor device mountable to a wiring board, comprising:

a package having a bottom surface which faces said wiring board when said semiconductor device is mounted on said wiring board, a first set of soldering bumps provided on said bottom surface of said package for making electrical contact with said wiring board;

a second set of soldering bumps provided on said bottom surface of said package for making electrical contact with said wiring board, the second set of soldering bumps intentionally differing from the first set of soldering bumps in that the second set of soldering bumps has a different size than the first set of soldering bumps, the second set of soldering bumps being located at a position where the second set of soldering bumps is observable when said semiconductor device is mounted on said wiring board, and a third set of soldering bumps, said second set of soldering bumps being larger than said first and third sets of soldering bumps, said third set of soldering bumps being smaller than said first set of bumps.

2. The semiconductor device as claimed in claim 1 wherein said first, second and third sets of soldering bumps are located in the vicinity of sides of said bottom surface of said package, adjacent soldering bumps among said first, second and third sets of soldering bumps having different sizes.

3. A semiconductor device mountable to a wiring board, comprising:

a package having a bottom surface which faces said wiring board when said semiconductor device is mounted on said wiring board;

a first set of soldering bumps provided on said bottom surface of said package for making electrical contact with said wiring board; and a second set of soldering bumps provided on said bottom surface of said package for making electrical contact with said wiring board the second set of soldering bumps intentionally differing from the first set of soldering bumps in that the second set of soldering bumps has a different size than the first set of soldering bumps, the second set of soldering bumps being located at a position where the second set of soldering bumps is observable when said semiconductor device is mounted on said wiring board, said first set of soldering bumps having a regular size and said second set of soldering bumps being smaller than said first set of soldering bumps, said package having a conductive member electrically connected to said second set of soldering bumps, said conductive member being electrically connected to an external apparatus in a state where said semiconductor device is mounted on said wiring board.

* * * * *

UNITED STATES PATENT AND TRADEMARK OFFICE
CERTIFICATE OF CORRECTION

PATENT NO.: 5,828,128
DATED : October 27, 1998
INVENTOR(S): Yutaka HIGASHIGUCHI et al.

It is certified that error appears in the above-identified patent and that said Letters Patent is hereby corrected as shown below:

Col. 17, line 15, change "," to --;--;
line 29, change "," to --;--.

Col. 18, line 17, after "board" insert --,--.

Signed and Sealed this

Sixteenth Day of March, 1999

Attest:

Attesting Officer

Q. TODD DICKINSON

Acting Commissioner of Patents and Trademarks